(12) United States Patent
Li et al.

(10) Patent No.: US 12,262,611 B2
(45) Date of Patent: Mar. 25, 2025

(54) DISPLAY PANEL AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Huijun Li, Beijing (CN); Tingliang Liu, Beijing (CN); Tinghua Shang, Beijing (CN); Huijuan Yang, Beijing (CN); Lulu Yang, Beijing (CN); Xiaofeng Jiang, Beijing (CN); Yi Qu, Beijing (CN); Xin Zhang, Beijing (CN); Meng Zhang, Beijing (CN); Junxi Wang, Beijing (CN); Siyu Wang, Beijing (CN); Lu Bai, Beijing (CN); Jie Dai, Beijing (CN); Hao Zhang, Beijing (CN); Yu Wang, Beijing (CN); Mengqi Wang, Beijing (CN)

(73) Assignees: Chengdu BOE Optoelectronics Technology Co., Ltd., Sichuan Province (CN); BOE Technology Group Co., Ltd., Beijing (CN)

( * ) Notice: Subject to any disclaimer, the term of this patent is extended or adjusted under 35 U.S.C. 154(b) by 402 days.

(21) Appl. No.: 17/755,304

(22) PCT Filed: Mar. 25, 2020

(86) PCT No.: PCT/CN2020/081168
§ 371 (c)(1),
(2) Date: Apr. 26, 2022

(87) PCT Pub. No.: WO2021/189313
PCT Pub. Date: Sep. 30, 2021

(65) Prior Publication Data
US 2022/0367602 A1 Nov. 17, 2022

(51) Int. Cl.
*H10K 59/131* (2023.01)
*H10K 59/121* (2023.01)
*H10K 59/35* (2023.01)

(52) U.S. Cl.
CPC ..... *H10K 59/1315* (2023.02); *H10K 59/1213* (2023.02); *H10K 59/353* (2023.02)

(58) Field of Classification Search
None
See application file for complete search history.

(56) References Cited

U.S. PATENT DOCUMENTS

2016/0322450 A1  11/2016  Lee et al.
2017/0316739 A1* 11/2017  Oh ................. G09G 3/3233
(Continued)

FOREIGN PATENT DOCUMENTS

CN  1645445 A  7/2005
CN  109887953 A  6/2019
(Continued)

OTHER PUBLICATIONS

European extended Search Report, mailed Apr. 3, 2023, from European patent app. No. 20926764.0.

*Primary Examiner* — Cory W Eskridge
(74) *Attorney, Agent, or Firm* — Workman Nydegger

(57) ABSTRACT

Disclosed are a display panel and a display device. The display panel comprises: a base substrate, a plurality of scanning lines, a first insulating layer, a plurality of data lines, an interlayer insulating layer, and an auxiliary power line. The auxiliary power line comprises: a plurality of sub-auxiliary power lines and a plurality of auxiliary conduction lines; the plurality of sub-auxiliary power lines are arranged in a first direction and extend in a second direction, and two sub-auxiliary power lines that are at least partially adjacent are electrically connected by means of at least one auxiliary conduction line; the orthographic projection of at (Continued)

least one of the plurality of auxiliary conduction lines on the base substrate does not overlap the orthographic projections of the scanning lines on the base substrate.

17 Claims, 19 Drawing Sheets

(56) References Cited

U.S. PATENT DOCUMENTS

| | | | |
|---|---|---|---|
| 2018/0138259 A1 | 5/2018 | Kim et al. | |
| 2021/0265456 A1* | 8/2021 | Lee | H10K 59/1315 |
| 2021/0350748 A1* | 11/2021 | Dong | G09G 3/3275 |
| 2022/0123074 A1* | 4/2022 | Zhang | H10K 59/352 |
| 2022/0320214 A1* | 10/2022 | Qu | H10K 59/126 |

FOREIGN PATENT DOCUMENTS

| | | |
|---|---|---|
| CN | 110224003 A | 9/2019 |
| CN | 110473978 A | 11/2019 |
| EP | 3462499 A2 | 4/2019 |
| EP | 4068260 A1 | 10/2022 |

\* cited by examiner

500

400

DISPLAY PANEL AND DISPLAY DEVICE

The present disclosure is a National Stage of International Application No. PCT/CN2020/081168, filed on Mar. 25, 2020, which is incorporated herein by reference.

FIELD

The embodiment of the present disclosure relates to the technical field of display, in particular to a display panel and a display apparatus.

BACKGROUND

Organic light emitting diodes (OLEDs), quantum dot light emitting diodes (QLEDs) and other electroluminescent diodes have the advantages of self-luminescence, low energy consumption, etc., and are one of hot spots in the application research field of current electroluminescent display apparatuses.

SUMMARY

An embodiment of the present disclosure provides a display panel, including: a base substrate; a gate conductive layer on the base substrate, including a plurality of scanning lines; a first insulating layer on the gate conductive layer; a first conductive layer on a side of the first insulating layer away from the base substrate, including a plurality of data lines, wherein the plurality of data lines are arranged in a first direction; an interlayer insulating layer on a side of the first conductive layer away from the base substrate; and a second conductive layer on a side of the interlayer insulating layer away from the base substrate, including an auxiliary power line; wherein the auxiliary power line includes: a plurality of sub-auxiliary power lines and a plurality of auxiliary conduction lines; the plurality of sub-auxiliary power lines are arranged in the first direction and extend in a second direction, and adjacent two of at least part of the sub-auxiliary power lines are electrically connected by at least one auxiliary conduction line; the first direction and the second direction are different; and an orthographic projection of at least one of the plurality of auxiliary conduction lines on the base substrate does not overlap an orthographic projection of the scanning lines on the base substrate.

Optionally, in the embodiment of the present disclosure, the plurality of scanning lines includes first scanning lines and second scanning lines; the second scanning lines include scanning line portions and a plurality of protrusion portions that are electrically connected to each other; the scanning line portions extend in the first direction, and the protrusion portions extend in the second direction; the display panel further includes: a plurality of sub-pixels; at least one of the plurality of sub-pixels includes a pixel driving circuit; the pixel driving circuit includes a transistor; and the protrusion portions serve as a gate of the transistor, and the orthographic projection of each of the auxiliary conduction lines on the base substrate does not overlap an orthographic projection of the protrusion portions on the base substrate.

Optionally, in the embodiment of the present disclosure, the pixel driving circuit includes a driving transistor and a threshold compensation transistor; the threshold compensation transistor includes a first sub-compensation transistor and a second sub-compensation transistor; a gate of the first sub-compensation transistor is electrically connected to a second scanning line, a first electrode of the first sub-compensation transistor is electrically connected to a gate of the driving transistor, and a second electrode of the first sub-compensation transistor is electrically connected to a first electrode of the second sub-compensation transistor; a gate of the second sub-compensation transistor is electrically connected to the second scanning line, and a second electrode of the second sub-compensation transistor is electrically connected to a second electrode of the driving transistor; a protrusion portions serves as the gate of the first sub-compensation transistor; and part of a scanning line portion serves as the gate of the second sub-compensation transistor.

Optionally, in the embodiment of the present disclosure, the display panel further includes: a plurality of repeating elements; wherein the repeating elements include a plurality of sub-pixels; the plurality of repeating elements are arranged in the first direction to form a repeating element row, and the repeating element row is arranged in the second direction; the auxiliary conduction lines include first auxiliary conduction lines; adjacent two of part of the sub-auxiliary power lines are electrically connected by at least one first auxiliary conduction line of the first auxiliary conduction lines; one repeating element row corresponds to one first scanning line, one second scanning line and at least one first auxiliary conduction line; and for the first scanning line, the second scanning line and the first auxiliary conduction line that correspond to the same repeating element row, an orthographic projection of the first auxiliary conduction line on the base substrate is between orthographic projections of the protrusion portions of the first scanning line and the second scanning line on the base substrate.

Optionally, in the embodiment of the present disclosure, the display panel further includes: a planarization layer on a side of the second conductive layer away from the base substrate; and a first electrode layer on a side of the planarization layer away from the base substrate, including: a plurality of first electrodes spaced apart from each other; wherein one sub-pixel is provided with one first electrode; and an orthographic projection of the first auxiliary conduction lines on the base substrate does not overlap an orthographic projection of the first electrodes on the base substrate.

Optionally, in the embodiment of the present disclosure, the sub-pixels in the plurality of repeating elements include: first-color sub-pixels, second-color sub-pixel pairs and third-color sub-pixels arranged in the first direction; each of the second-color sub-pixel pairs includes two second-color sub-pixels arranged in the second direction; and the repeating elements in two adjacent repeating element rows are arranged in a misalignment manner.

Optionally, in the embodiment of the present disclosure, each of at least part of the second-color sub-pixel pairs corresponds to one first auxiliary conduction line; and the orthographic projection of the first auxiliary conduction line on the base substrate is between orthographic projections of two first electrodes in the second-color sub-pixel pair, corresponding to the first auxiliary conduction line, on the base substrate.

Optionally, in the embodiment of the present disclosure, the pixel driving circuit further includes a data writing transistor; data writing transistors in a column of sub-pixels are electrically connected to one data line; and for the second-color sub-pixel pair and the first-color sub-pixel in the same repeating element, an orthographic projection of the first auxiliary conduction line corresponding to the second-color sub-pixel pair on the base substrate and an orthographic projection of the data line electrically connected to the first-color sub-pixel on the base substrate have an overlapping region.

Optionally, in the embodiment of the present disclosure, the data writing transistor is electrically connected to the data line by a first connection via hole; and for the second-color sub-pixel pair and the first-color sub-pixel in the same repeating element, the orthographic projection of the first auxiliary conduction line corresponding to the second-color sub-pixel pair on the base substrate and an orthographic projection of the first connection via hole in the first-color sub-pixel on the base substrate have an overlapping region.

Optionally, in the embodiment of the present disclosure, the pixel driving circuit further includes a first reset transistor; the display panel further includes a plurality of first reset signal lines; the first reset transistor in each of the sub-pixels is electrically connected to a first reset signal line through a second connection via hole; and the second-color sub-pixel pair includes: a first second-color sub-pixel and a second second-color sub-pixel arranged in the second direction; the orthographic projection of the first auxiliary conduction line on the base substrate and an edge of an orthographic projection of the second connection via hole in the second second-color sub-pixel on the base substrate have an overlapping region.

Optionally, in the embodiment of the present disclosure, the first auxiliary conduction lines extend in a linear shape in the first direction.

Optionally, in the embodiment of the present disclosure, the auxiliary conduction lines further include second auxiliary conduction lines; and adjacent two of the rest of the sub-auxiliary power lines are electrically connected by at least one second auxiliary conduction line.

Optionally, in the embodiment of the present disclosure, for the first-color sub-pixel in one repeating element row and a third-color sub-pixel, closest to the first-color sub-pixel, in an adjacent repeating element row, an orthographic projection of one second auxiliary conduction line on the base substrate is between an orthographic projection of a first electrode in the first-color sub-pixel on the base substrate and an orthographic projection of a first electrode in the third-color sub-pixel on the base substrate.

Optionally, in the embodiment of the present disclosure, for the first-color sub-pixel in one repeating element row and the third-color sub-pixel, closest to the first-color sub-pixel, in the adjacent repeating element row, the orthographic projection of the second auxiliary conduction line on the base substrate is closer to the orthographic projection of the first electrode in the third-color sub-pixel on the base substrate than the orthographic projection of the first electrode in the first-color sub-pixel on the base substrate.

Optionally, in the embodiment of the present disclosure, the first conductive layer further includes a main power line; the main power line and the data lines are spaced apart; the interlayer insulating layer has a first power via hole; and the main power line and the auxiliary power line are electrically connected to each other through the first power via hole.

Optionally, in the embodiment of the present disclosure, an orthographic projection of the main power line on the base substrate and an orthographic projection of the auxiliary power line on the base substrate have an overlapping region.

Optionally, in the embodiment of the present disclosure, the sub-auxiliary power lines and the auxiliary conduction lines roughly form a grid structure.

Optionally, in the embodiment of the present disclosure, the auxiliary power line is configured as a power line that transmits a driving voltage.

An embodiment of the present disclosure further provides a display apparatus, including the above display panel.

DETAILED DESCRIPTION OF THE EMBODIMENTS

Figure 1:
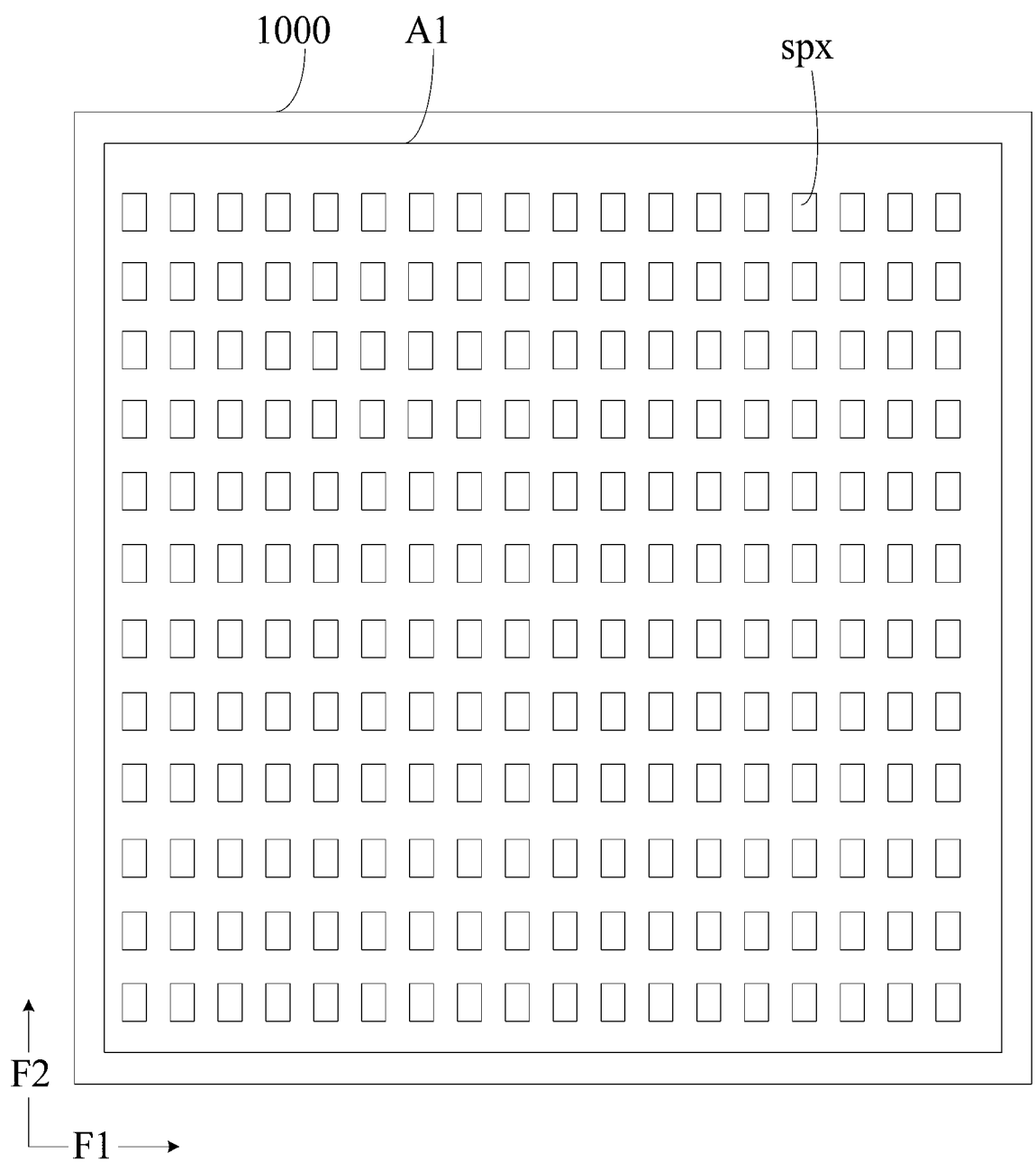
FIG. 1 is a schematic structural diagram of some display panels provided by an embodiment of the present disclosure.

In order to make the objectives, technical solutions, and advantages of embodiments of the present disclosure clearer, the technical solutions of the embodiments of the present disclosure will be described clearly and completely with reference to the accompanying drawings of the embodiments of the present disclosure. Apparently, the described embodiments are some, but not all, embodiments of the present disclosure. Under the condition of no conflict, the embodiments in the present disclosure and the features in the embodiments can be combined with each other. Based on the described embodiments of the present disclosure, all other embodiments attainable by those ordinarily skilled in the art without involving any inventive effort are within the protection scope of the present disclosure.

Unless defined otherwise, technical terms or scientific terms used in the present disclosure shall have the ordinary meaning as understood by those ordinarily skilled in the art to which the present disclosure belongs. The "first", "second" and similar words used in the present disclosure do not indicate any order, quantity or importance, but are only used to distinguish different components. The word "include" or "comprise", and other similar words mean that a component or an article that precedes the word is inclusive of the component or article listed after the word and equivalents thereof, but does not exclude other components or articles. Similar words such as "connection" or "connected" are not limited to physical or mechanical connections, but may include electrical connections, whether direct or indirect.

It should be noted that dimensions and shapes of various figures in the drawings are not to truly scale and are intended to be merely illustrative of the present disclosure. The same or similar reference numerals refer to the same or similar components or components having the same or similar functions throughout.

Figure 2A:
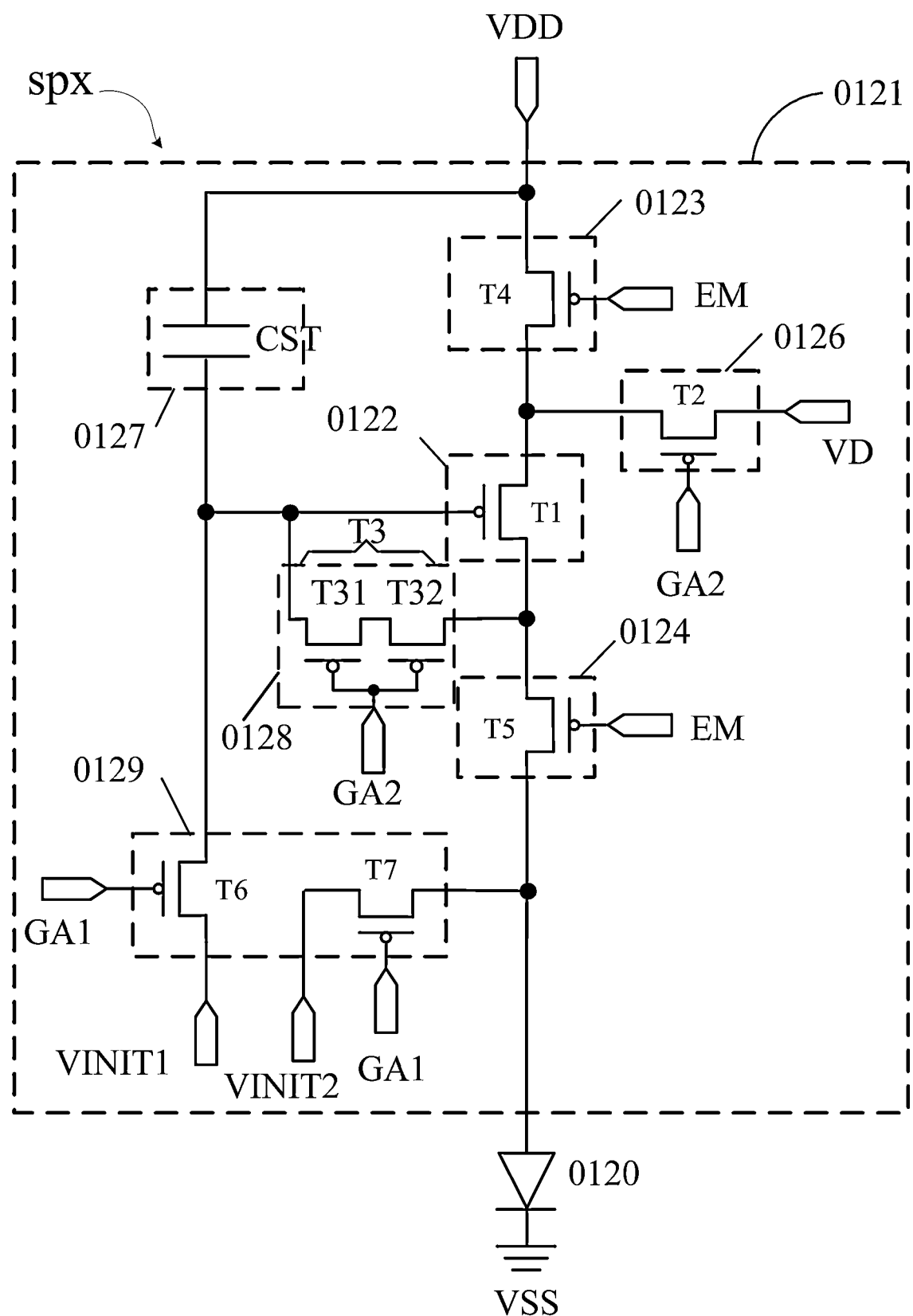
FIG. 2A is a schematic diagram of a circuit structure in some sub-pixels provided by an embodiment of the present disclosure.

As shown in FIG. 1, a display panel provided by an embodiment of the present disclosure may include a base substrate 1000, and a plurality of sub-pixels spx in a display region A1 of the base substrate 1000. Exemplarily, as shown in FIG. 1 and FIG. 2A, at least one sub-pixel spx of the plurality of sub-pixels spx may include: a pixel driving circuit 0121 and a light emitting device 0120. The pixel driving circuit 0121 has a transistor and a capacitor, and generates an electrical signal through the interaction between the transistor and the capacitor, and the generated electrical signal is input to a first electrode of the light emitting device 0120. In addition, a corresponding voltage is applied to a second electrode of the light emitting device 0120 to drive the light emitting device 0120 to emit light.

As shown in FIG. 2A, the pixel driving circuit 0121 may include: a driving control circuit 0122, a first light emitting control circuit 0123, a second light emitting control circuit 0124, a data writing circuit 0126, a storage circuit 0127, a threshold compensation circuit 0128, and a reset circuit 0129.

The driving control circuit 0122 may include a control terminal, a first terminal and a second terminal. The driving control circuit 0122 is configured to provide the light emitting device 0120 with a driving current for driving the light emitting device 0120 to emit light. For example, the first light emitting control circuit 0123 is connected to the first terminal of the driving control circuit 0122 and a first power terminal VDD. The first light emitting control circuit 0123 is configured to realize on or off of connection between the driving control circuit 0122 and the first power terminal VDD.

The second light emitting control circuit 0124 is electrically connected to the second terminal of the driving control circuit 0122 and the first electrode of the light emitting device 0120. The second light emitting control circuit 0124 is configured to realize on or off of connection between the driving control circuit 0122 and the light emitting device 0120.

The data writing circuit 0126 is electrically connected to the first terminal of the driving control circuit 0122. The second light emitting control circuit 0124 is configured to write a signal on a data line VD into the storage circuit 0127 under the control of a signal on a scanning line GA2.

The storage circuit 0127 is electrically connected to the control terminal of the driving control circuit 0122 and the first power terminal VDD. The storage circuit 0127 is configured to store a data signal.

The threshold compensation circuit 0128 is electrically connected to the control terminal and the second terminal of the driving control circuit 0122. The threshold compensation circuit 0128 is configured to perform threshold compensation on the driving control circuit 0122.

The reset circuit 0129 is electrically connected to the control terminal of the driving control circuit 0122 and the first electrode of the light emitting device 0120. The reset circuit 0129 is configured to reset the control terminal of the driving control circuit 0122 and the first electrode of the light emitting device 0120 under the control of signals on a gate line GA1.

The light emitting device 0120 may be configured as an electroluminescent diode, such as at least one of an OLED or a QLED. The light emitting device 0120 may include the first electrode, a light emitting function layer, and the second electrode that are stacked. Exemplarily, the first electrode may be an anode, and the second electrode may be a cathode. The light emitting functional layer may include a light emitting layer. Further, the light emitting functional layer may also include film layers such as a hole injection layer, a hole transport layer, a light emitting layer, an electron transport layer, and an electron injection layer. Of course, in practical applications, the light emitting device 0120 may be designed and determined according to the requirements of practical application environments, which is not limited herein.

Exemplarily, as shown in FIG. 2A, the driving control circuit 0122 includes a driving transistor T1, the control terminal of the driving control circuit 0122 includes a gate of the driving transistor T1, the first terminal of the driving control circuit 0122 includes a first electrode of the driving transistor T1, and the second terminal of the driving control circuit 0122 includes a second electrode of the driving transistor T1.

Exemplarily, as shown in FIG. 2A, the data writing circuit 0126 includes a data writing transistor T2. The storage circuit 0127 includes a storage capacitor CST. The threshold compensation circuit 0128 includes a threshold compensation transistor T3. The first light emitting control circuit 0123 includes a first light emitting control transistor T4. The second light emitting control circuit 0124 includes a second light emitting control transistor T5. The reset circuit 0129 includes a first reset transistor T6 and a second reset transistor T7.

Specifically, a first electrode of the data writing transistor T2 is electrically connected to the first electrode of the driving transistor T1, a second electrode of the data writing transistor T2 is configured to be electrically connected to the data line VD to receive the data signal, and a gate of the writing transistor T2 is configured to be electrically connected to a second scanning line GA2 to receive a scanning signal.

A first electrode of the storage capacitor CST is electrically connected to the first power terminal VDD, and a second electrode of the storage capacitor CST is electrically connected to the gate of the driving transistor T1.

A first electrode of the threshold compensation transistor T3 is electrically connected to the second electrode of the driving transistor T1, a second electrode of the threshold compensation transistor T3 is electrically connected to the gate of the driving transistor T1, and a gate of the threshold compensation transistor T3 is configured to be electrically connected to a second scanning line GA2 to receive a scanning signal.

A first electrode of the first reset transistor T6 is configured to be electrically connected to a first reset signal line VINIT1 to receive a first reset signal, a second electrode of the first reset transistor T6 is electrically connected to the gate of the driving transistor T1, and a gate of the first reset transistor T6 is configured to be electrically connected to a first scanning line GA1 to receive a control signal.

A first electrode of the second reset transistor T7 is configured to be electrically connected to a second reset signal line VINIT2 to receive a second reset signal, a second electrode of the second reset transistor T7 is electrically connected to the first electrode of the light emitting device 0120, and a gate of the second reset transistor T7 is configured to be electrically connected to a first scanning line GA1 to receive a control signal.

A first electrode of the first light emitting control transistor T4 is electrically connected to the first power terminal VDD, a second electrode of the first light emitting control transistor T4 is electrically connected to the first electrode of the driving transistor T1, and a gate of the first light emitting control transistor T4 is configured to be electrically connected with a light emitting control line EM to receive a light emitting control signal.

A first electrode of the second light emitting control transistor T5 is electrically connected to the second electrode of the driving transistor T1, a second electrode of the second light emitting control transistor T5 is electrically connected to the first electrode of the light emitting device 0120, and a gate of the second light emitting control transistor T5 is configured to be electrically connected to a light emitting control line EM to receive a light emitting control signal.

The second electrode of the light emitting device 0120 is electrically connected to a second power terminal VSS. The first electrodes and the second electrodes of the above transistors may be determined as source electrodes or drain electrodes according to the practical applications, which is not limited herein.

Exemplarily, as shown in FIG. 2A, the threshold compensation transistor T3 may include: a first sub-compensation transistor T31 and a second sub-compensation transistor T32.

A gate of the first sub-compensation transistor T31 is electrically connected to the second scanning line GA2, a first electrode of the first sub-compensation transistor T31 is electrically connected to the gate of the driving transistor T1, and a second electrode of the first sub-compensation transistor T31 is electrically connected to a first electrode of the second sub-compensation transistor T32.

A gate of the second sub-compensation transistor T32 is electrically connected to the second scanning line GA2, and a second electrode of the second sub-compensation transistor T32 is electrically connected to the second electrode of the driving transistor T1.

Exemplarily, one of the first power terminal VDD and the second power terminal VSS is a high-voltage terminal, and the other is a low-voltage terminal. For example, in the embodiment shown in FIG. 2A, the first power terminal VDD is a voltage source to output a constant first voltage, and the first voltage is a positive voltage; and the second power terminal VSS may be a voltage source to output a constant first voltage, and the second voltage is a negative voltage, etc. For example, in some examples, the second power terminal VSS may be grounded. The first reset signal line VINIT1 and the second reset signal line VINIT2 are the same signal line.

Figure 2B:
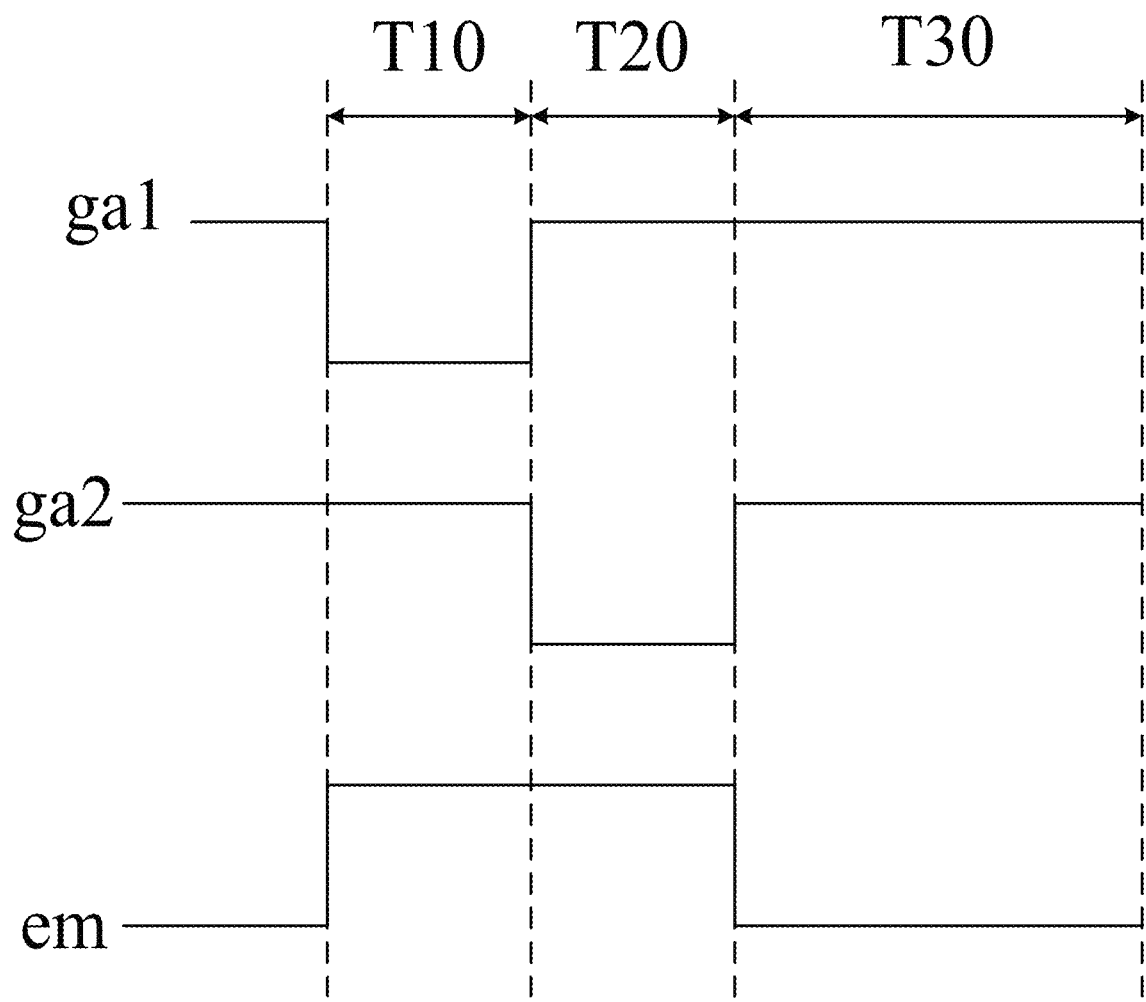
FIG. 2B is a timing diagram of some signals provided by an embodiment of the present disclosure.

A signal timing diagram corresponding to the pixel driving circuit shown in FIG. 2A is shown in FIG. 2B. In one frame of display time, a working process of the pixel driving circuit has three stages: T10 stage, T20 stage, and T30 stage, ga1 represents a signal transmitted on the first scanning lines GA1, ga2 represents a signal transmitted on the second scanning lines GA2, and em represents a signal transmitted on the light emitting control lines EM.

In the T10 stage, the signal ga1 controls the first reset transistor T6 and the second reset transistor T7 to be turned on. The turned-on first reset transistor T6 provides the signal transmitted on the first reset signal line VINIT1 to the gate of the driving transistor T1 to reset the gate of the driving transistor T1. The turned-on second reset transistor T7 provides the signal transmitted on the first reset signal line VINIT1 to the first electrode of the light emitting device 0120 to reset the first electrode of the light emitting device 0120. In addition, in this stage, the signal ga2 controls the data writing transistor T2, the first sub-compensation transistor T31, and the second sub-compensation transistor T32 to be turned off. The signal em controls both the first light emitting control transistor T4 and the second light emitting control transistor T5 to be turned off.

In the T20 stage, the signal ga2 controls the data writing transistor T2, the first sub-compensation transistor T31, and the second sub-compensation transistor T32 to be turned on, so that the data signal transmitted on the data line VD can charge the gate of the driving transistor T1, and the voltage of the gate of the driving transistor T1 becomes: Vdata+|Vth|. Vth represents a threshold voltage of the driving transistor T1, and Vdata represents a voltage of the data signal. Moreover, in this stage, the signal ga1 controls both the first reset transistor T6 and the second reset transistor T7 to be turned off. The signal em controls both the first light emitting control transistor T4 and the second light emitting control transistor T5 to be turned off.

In the T30 stage, the signal em controls both the first light emitting control transistor T4 and the second light emitting control transistor T5 to be turned on. The turned-on first light emitting control transistor T4 provides a voltage Vdd of the first power terminal VDD to the first electrode of the driving transistor T1, so that the voltage of the first electrode of the driving transistor T1 is Vdd. The driving transistor T1 generates a driving current according to its gate voltage Vdata+|Nth| and the voltage Vdd of the first electrode. The driving current is provided to the light emitting device 0120 through the turned-on second light emitting control transistor T5 to drive the light emitting device 0120 to emit light. Moreover, in this stage, the signal ga1 controls both the first reset transistor T6 and the second reset transistor T7 to be turned off. The signal ga2 controls the data writing transistor T2, the first sub-compensation transistor T31 and the second sub-compensation transistor T32 to be turned off.

It should be noted that, in the embodiment of the present disclosure, the pixel driving circuit in each sub-pixel may not only have the structure shown in FIG. 2A, but also may be a structure including other quantities of transistors, which is not limited in the embodiment of the present disclosure.

Figure 3:
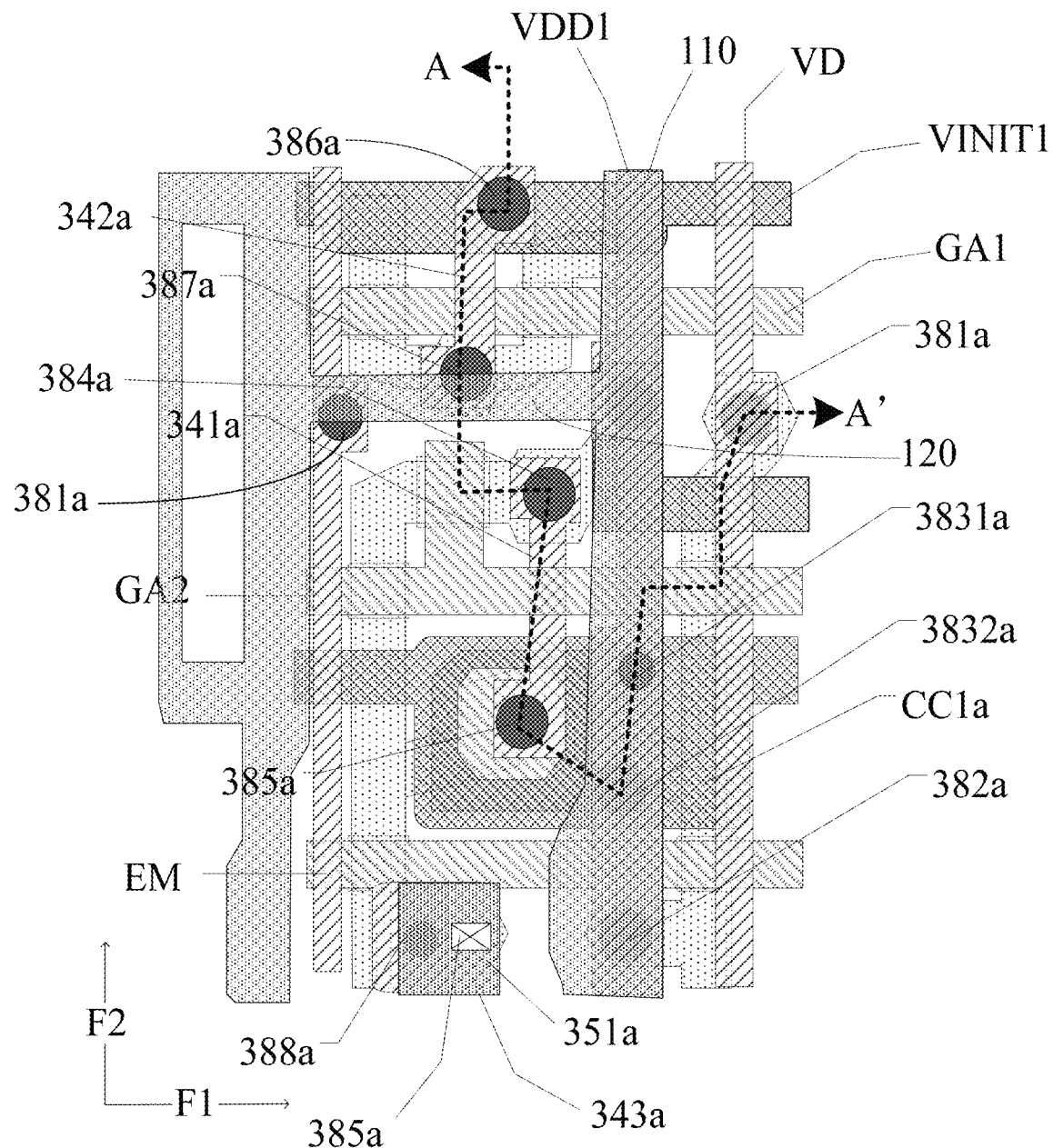
FIG. 3 is a schematic diagram of a layout structure in some sub-pixels provided by an embodiment of the present disclosure.

FIG. 3 is a schematic diagram of a layout structure of a pixel driving circuit provided by some embodiments of the present disclosure. FIGS. 4A to 4E are schematic diagrams of various layers of a pixel driving circuit provided by some embodiments of the present disclosure. Examples shown in FIGS. 3 to 4E take a pixel driving circuit of a sub-pixel spx as an example. FIGS. 3 to 4E also show the first scanning line GA1, the second scanning line GA2, the first reset signal line VINIT1 (the first reset signal line VINIT1 and the second reset signal line VINIT2 are the same signal line, so the first reset signal line VINIT1 is shown), the light emitting control line EM, the data line VD, a main power line VDD1, and an auxiliary power line VDD2 that are electrically connected to the pixel driving circuit 0121. The main power line VDD1 is electrically connected to the first power terminal VDD to input a driving voltage (i.e., the first voltage) to the first power terminal VDD. Exemplarily, a plurality of data lines VD may be arranged in the first direction F1.

Figure 4A:
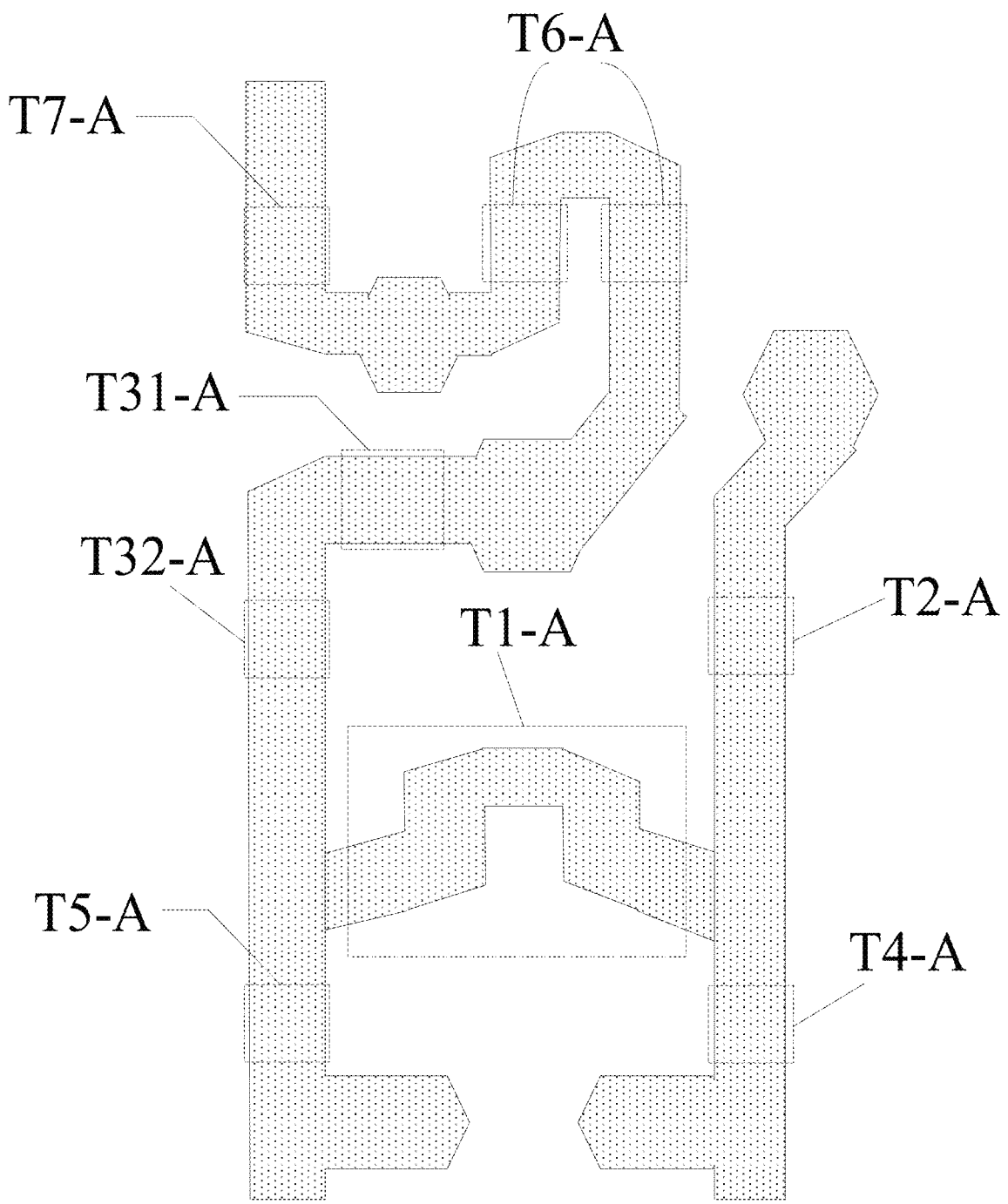
FIG. 4A is a schematic diagram of a layout structure of a semiconductor layer in some sub-pixels provided by an embodiment of the present disclosure.
Figure 5:
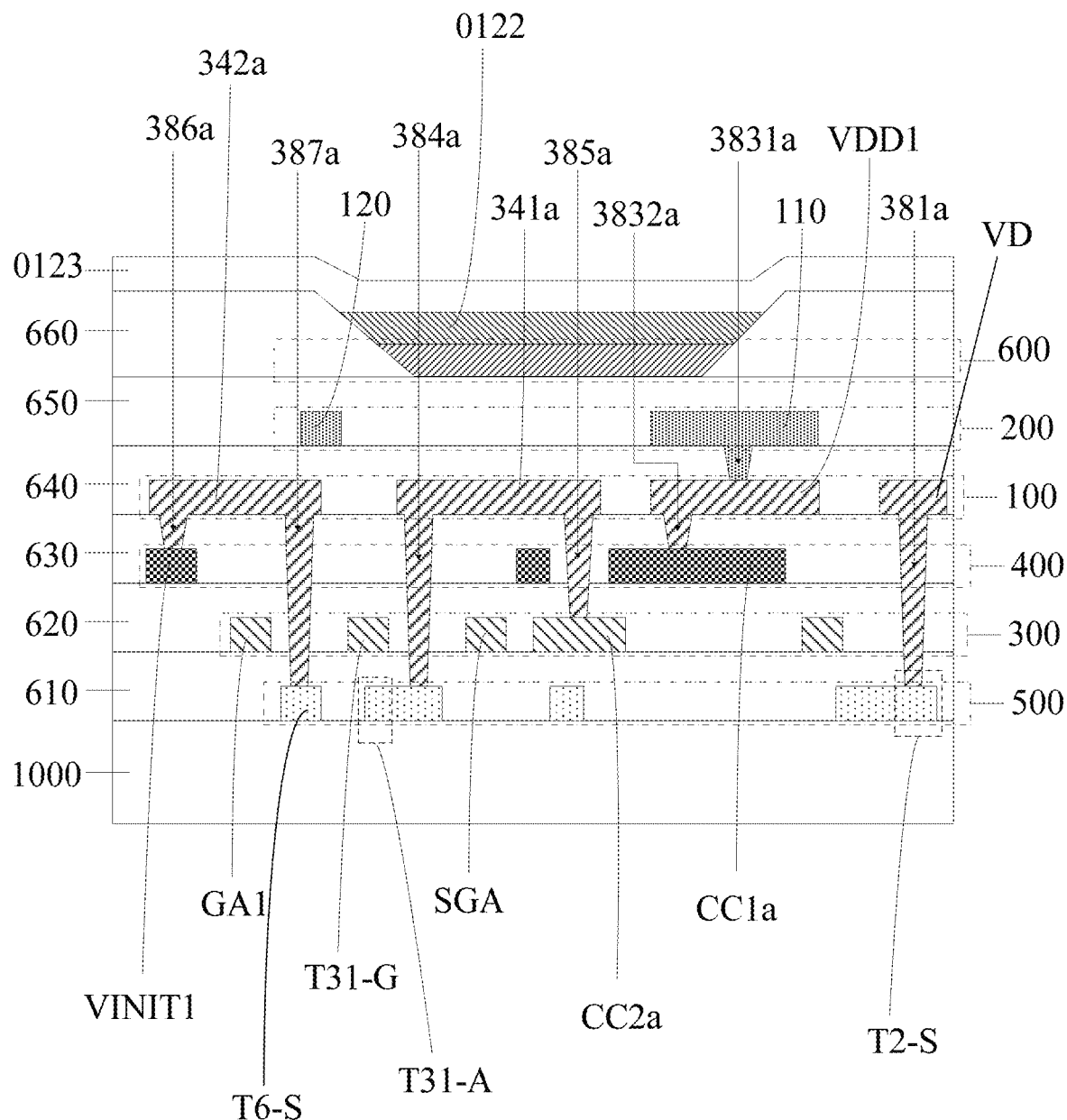
FIG. 5 is a schematic diagram of a cross-sectional structure in an AA' direction in the schematic diagram of the layout structure shown in FIG. 3.

Exemplarily, as shown in FIGS. 3, 4a, and 5, a semiconductor layer 500 of the pixel driving circuit 0121 is shown. The semiconductor layer 500 may be formed by patterning a semiconductor material. The semiconductor layer 500 may be configured to make active layers of the above driving transistor T1, the data writing transistor T2, a first sub-compensation transistor T31, a second sub-compensation transistor T32, the first light emitting control transistor T4, the second light emitting control transistor T5, the first reset transistor T6 and the second reset transistor T7, and each active layer may include a source region, a drain region and a channel region between the source region and the drain region. For example, FIG. 4A illustrates a channel region T1-A of the driving transistor T1, a channel region T2-A of the data writing transistor T2, a first channel region T31-A of the first sub-compensation transistor T31, a second channel region T31-A of the first sub-compensation transistor T31, a second channel region T32-A of the sub-compensation transistor T32, a channel region T4-A of the first light emitting control transistor T4, a channel region T5-A of the second light emitting control transistor T5, a channel region T6-A of the first reset transistor T6, and a channel region T7-A of the second reset transistor T7.

Moreover, exemplarily, the active layers of the transistors may be integrally disposed. Further, the semiconductor layer 500 may be made of amorphous silicon, polysilicon, oxide semiconductor materials, or the like. It should be noted that the above source regions and drain regions may be regions doped with n-type impurities or p-type impurities.

Figure 4B:
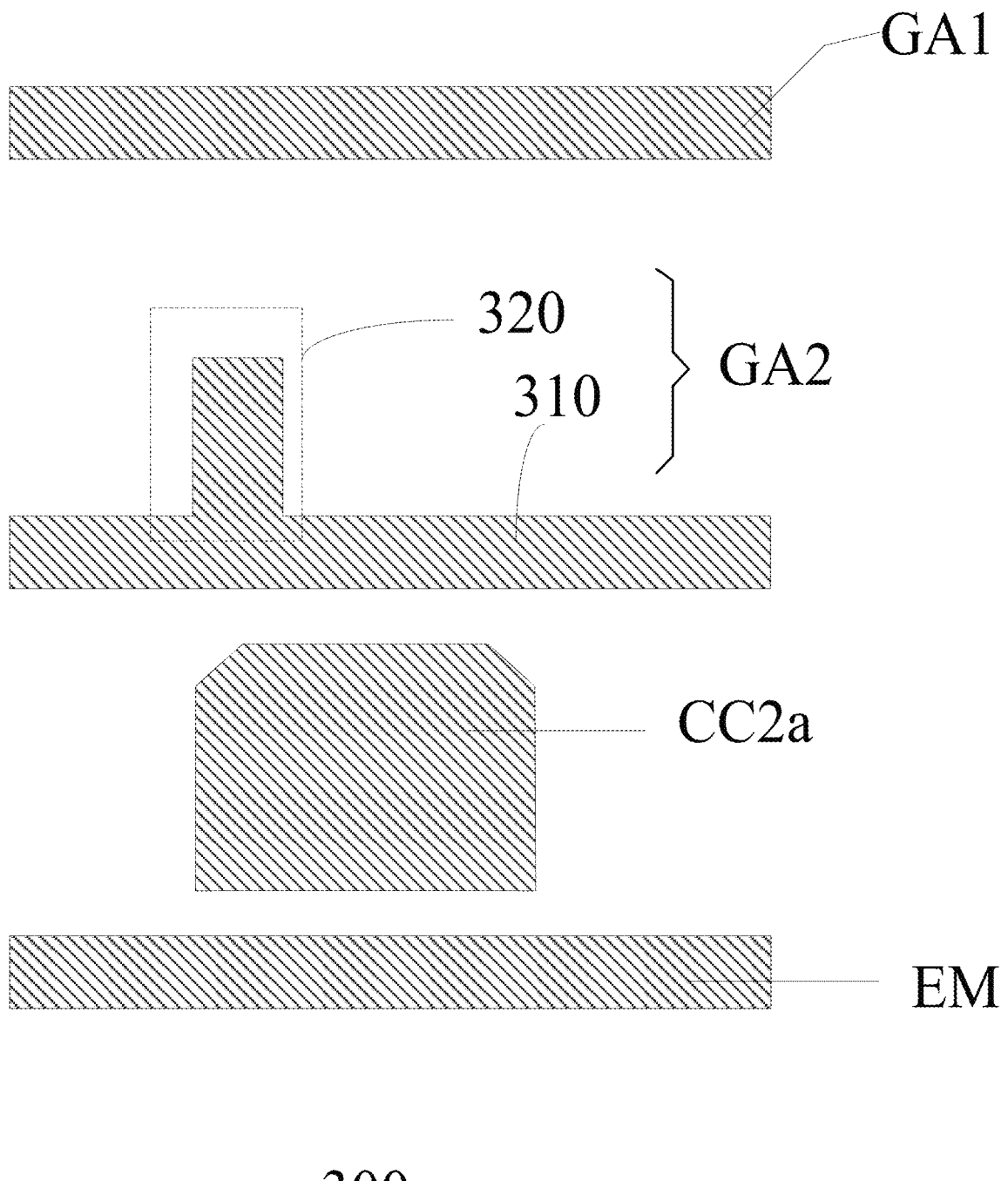
FIG. 4B is a schematic diagram of a layout structure of a gate conductive layer in some sub-pixels provided by an embodiment of the present disclosure.

Exemplarily, as shown in FIG. 5, a first gate insulating layer 610 is formed on the above semiconductor layer 500 and configured to protect the above semiconductor layer 500. As shown in FIGS. 3, 4B, and 5, a gate conductive layer 300 of the pixel driving circuit 0121 is shown. The gate conductive layer 300 is disposed on a side of the first gate insulating layer 610 away from the base substrate 1000 so as to be insulated from the semiconductor layer 500. The gate conductive layer 300 may include: a plurality of scanning lines, the second electrode CC2a of the storage capacitor CST, the light emitting control line EM, and the gates of the driving transistor T11, the data writing transistor T2, the first sub-compensation transistor T31, the second sub-compensation transistor T32, the first light emitting control transistor T4, the second light emitting control transistor T5, the first reset transistor T6 and the second reset transistor T7. Exemplarily, the plurality of scanning lines includes, for example, a plurality of first gate lines GA1 and a plurality of second gate lines GA2.

For example, as shown in FIGS. 3 to 4B, the gate of the data writing transistor T2 may be a first part where the second scanning line GA2 overlaps the semiconductor layer 500 (for example, a first part where the second scanning line GA2 overlaps the channel region T2-A of the data writing transistor T2), the gate of the first light emitting control transistor T4 may be a first part where the light emitting control line EM overlaps the semiconductor layer 500, the gate of the second light emitting control transistor T5 may be a second part where the light emitting control line EM overlaps the semiconductor layer 500, the gate of the first reset transistor T6 is a first part where the first scanning line GA1 overlaps the semiconductor layer 500, the gate of the second reset transistor T7 is a second part where the first scanning line GA1 overlaps the semiconductor layer 500, the threshold compensation transistor T3 may be a thin film transistor of a double-gate structure, the gate of the second sub-compensation transistor T32 may be a second part where the second scanning line GA2 overlaps the semiconductor layer 500 (for example, a second part where the second scanning line GA2 overlaps the second channel region T32-A of the second sub-compensation transistor T32), and the gate of the first sub-compensation transistor T31 may be a part where a protrusion portion 320 protruding from the second scanning line GA2 overlaps the semiconductor layer 500. Exemplarily, the gate of the driving transistor T1 may be set as the second electrode CC2a of the storage capacitor CST. That is, the gate of the driving transistor T1 and the second electrode CC2a of the storage capacitor CST are of an integral structure.

It should be noted that each dashed rectangular frame in FIG. 4A shows each part where the gate conductive layer 300 overlaps the semiconductor layer 500 in one sub-pixel spx.

Exemplarily, as shown in FIGS. 3 and 4B, the first scanning line GA1, the second scanning line GA2, and the light emitting control line EM are arranged in the second direction F2, and an orthographic projection of the second scanning line GA2 on the base substrate 1000 is located between an orthographic projection of the first scanning line GA1 on the base substrate 1000 and an orthographic projection of the light emitting control line EM on the base substrate 1000.

Exemplarily, as shown in FIGS. 3 and 4B, in the second direction F2, an orthographic projection of the second electrode CC2a of the storage capacitor CST on the base substrate 1000 is located between the orthographic projection of the second scanning line GA2 on the base substrate 1000 and the orthographic projection of the light emitting control line EM on the base substrate 1000. An orthographic projection of the protrusion portion 320 protruding from the second scanning line GA2 on the base substrate 1000 is located on a side of the orthographic projection of the second scanning line GA2 on the base substrate 1000 away from the orthographic projection of the light emitting control line EM on the base substrate 1000.

Exemplarily, as shown in FIGS. 3 and 4B, in the second direction F2, the gate of the data writing transistor T2, the gate of the threshold compensation transistor T3, the gate of the first reset transistor T6, and the gate of the second reset transistor T7 are all located on a first side of the gate of the driving transistor T1, and the gate of the first light emitting control transistor T4 and the gate of the second light emitting control transistor T5 are both located on a second side of the gate of the driving transistor T1.

For example, in some embodiments, as shown in FIGS. 3 and 4B, in the first direction F1, the gate of the data writing transistor T2 and the gate of the first light emitting control transistor T4 are both located in a third side of the gate of the driving transistor T1. A first gate of the threshold compensation transistor T3, the gate of the second light emitting control transistor T5 and the gate of the second reset transistor T7 are all located on a fourth side of the gate of the driving transistor T1. The third side and the fourth side of the gate of the driving transistor T1 are two opposite sides of the gate of the driving transistor T1 in the first direction F1.

Figure 4C:
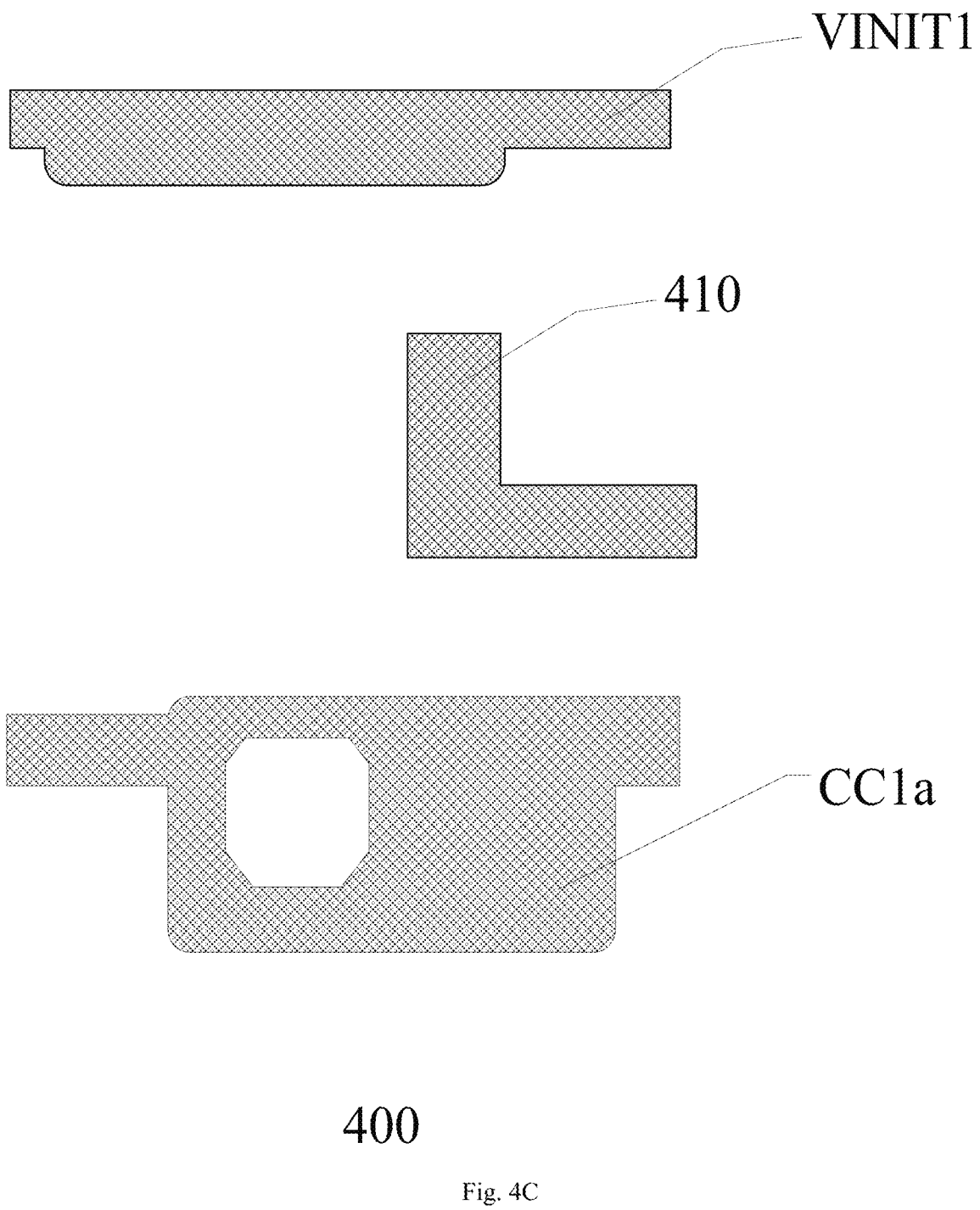
FIG. 4C is a schematic diagram of a layout structure of a capacitor electrode layer in some sub-pixels provided by an embodiment of the present disclosure.

Exemplarily, as shown in FIG. 5, a second gate insulating layer 620 is formed on the above gate conductive layer 300 and configured to protect the above gate conductive layer 300. As shown in FIGS. 3, 4C, and 5, a capacitor electrode layer 400 of the pixel driving circuit 0121 is shown. The capacitor electrode layer 400 is disposed on a side of the second gate insulating layer 620 away from the base substrate 1000. The capacitor electrode layer 400 may include the first electrode CC1a of the storage capacitor CST, the first reset signal line VINIT1, and a voltage stabilizing portion 410. Exemplarily, an orthographic projection of the first electrode CC1a of the storage capacitor CST on the base substrate 1000 and an orthographic projection of the second electrode CC2a of the storage capacitor CST on the base substrate 1000 at least partially overlap to form the storage capacitor CST. An orthographic projection of the voltage stabilizing portion 410 on the base substrate 1000 and an orthographic projection of the source region of the active layer of the data writing transistor T2 on the base substrate 1000 have an overlapping region. The orthographic projection of the voltage stabilizing portion 410 on the base substrate 1000 and an orthographic projection of the drain region of the active layer of the first reset transistor T6 on the base substrate 1000 have an overlapping region. In addition, the orthographic projection of the voltage stabilizing portion 410 on the base substrate 1000 and an orthographic projection of an adjacent conductor region between the first channel region T31-A of the first sub-compensation transistor T31 and the second channel region T32-A of the second sub-compensation transistor T32 on the base substrate 1000 has an overlapping region so as to reduce current leakage caused by a photoelectric effect.

Figure 4D:
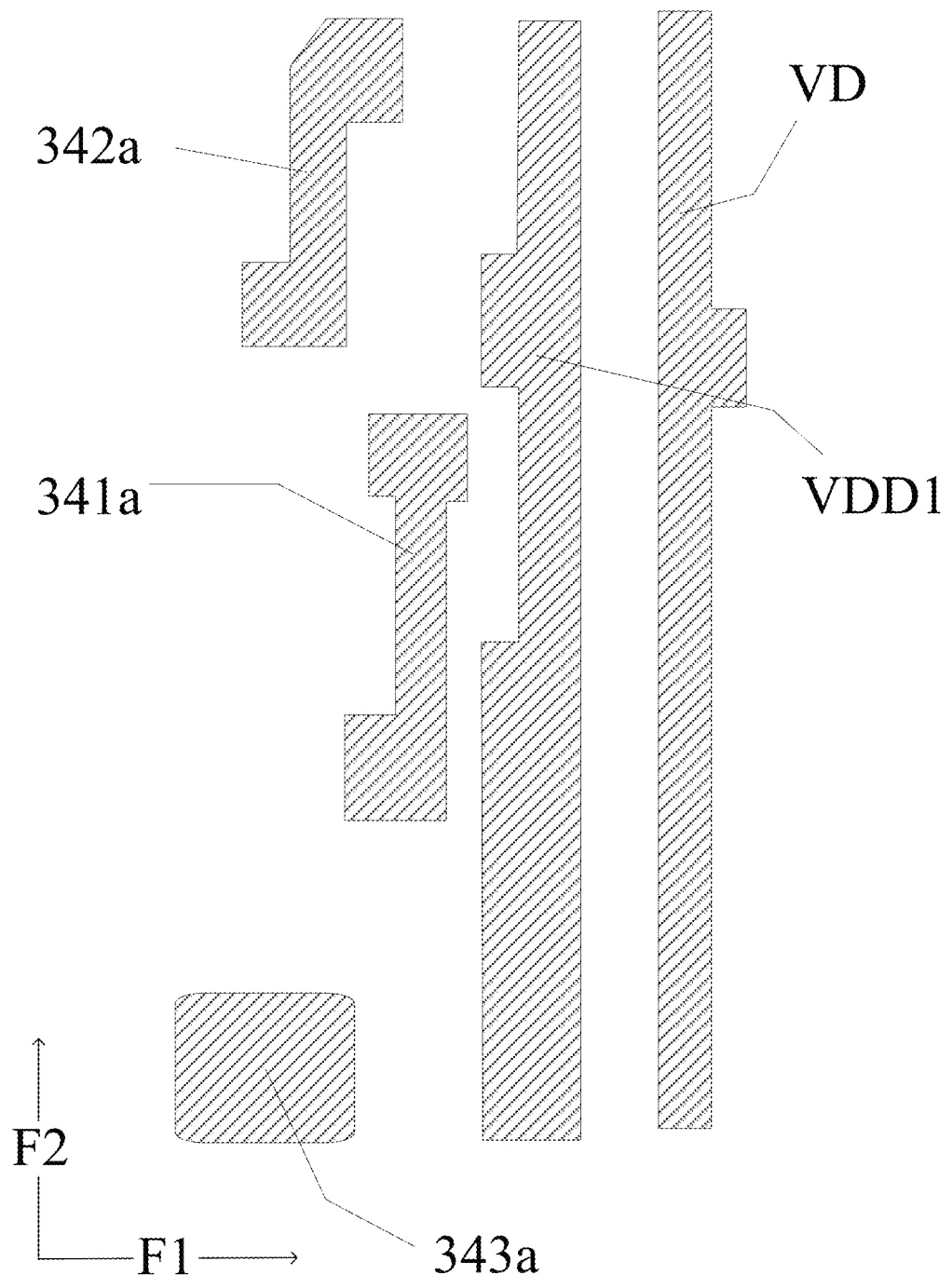
FIG. 4D is a schematic diagram of a layout structure of a first conductive layer in some sub-pixels provided by an embodiment of the present disclosure.
Figure 4E:
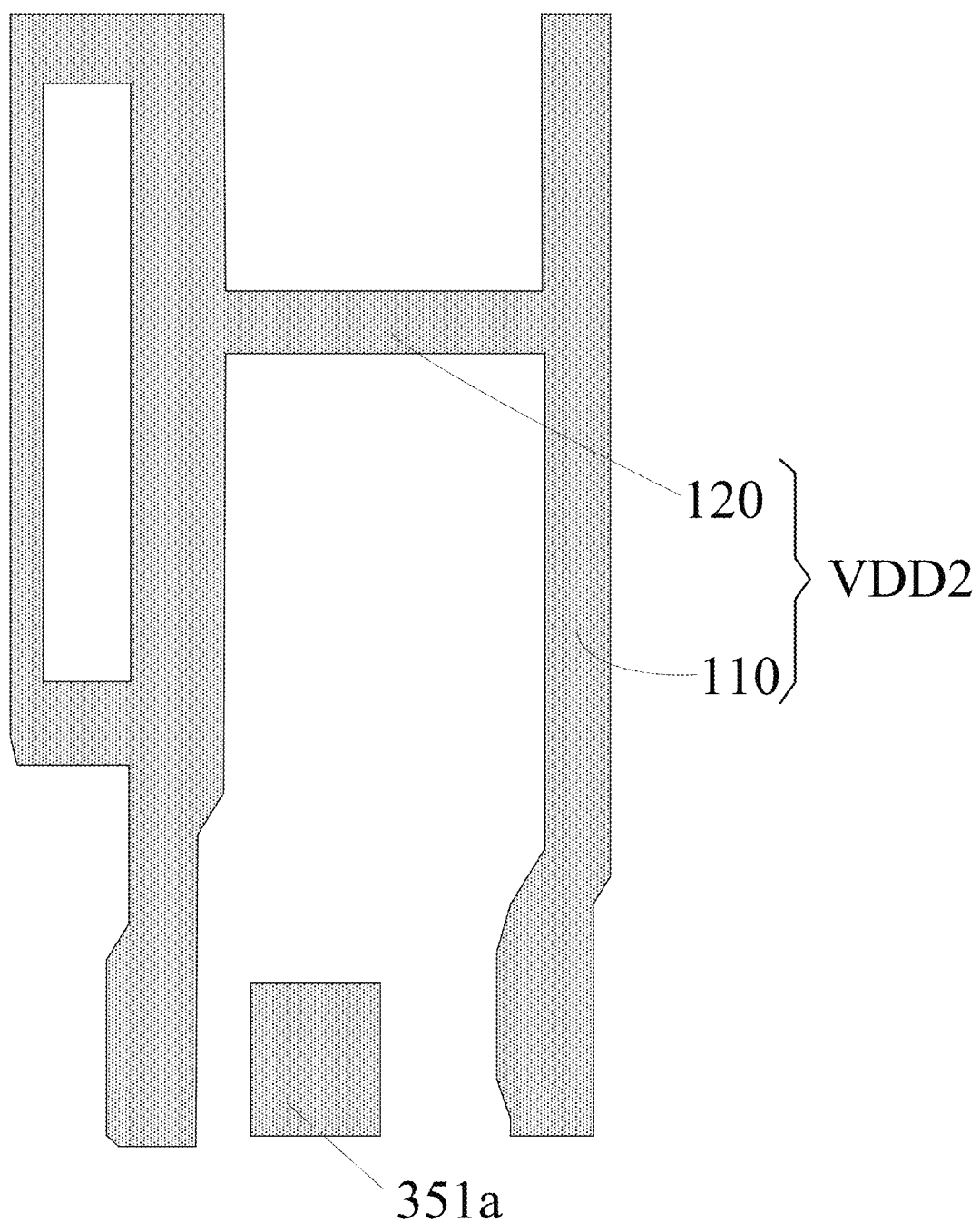
FIG. 4E is a schematic diagram of a layout structure of a second conductive layer in some sub-pixels provided by an embodiment of the present disclosure.

Exemplarily, as shown in FIG. 5, an interlayer dielectric layer 630 is formed on the above capacitor electrode layer 400 and configured to protect the above capacitor electrode layer 400. As shown in FIGS. 3, 4D, and 5, a first conductive layer 100 of the pixel driving circuit 0121 is shown. The first conductive layer 100 is disposed on a side of the interlayer dielectric layer 630 away from the base substrate 1000. The first conductive layer 100 may include: the data line VD, the main power line VDD1, and bridge portions 341a, 342a, and 343a. The data line VD and the main power line VDD1 are disposed at an interval.

Exemplarily, as shown in FIG. 5, an interlayer insulating layer 640 is formed on the above first conductive layer 100 and configured to protect the above first conductive layer 100. As shown in FIGS. 3, 4E, and 5, a second conductive layer 200 of the pixel driving circuit 0121 is shown. The second conductive layer 200 is disposed on a side of the interlayer insulating layer 640 away from the base substrate 1000. The second conductive layer 200 may include the auxiliary power line VDD2 and a transfer portion 351a. In addition, the interlayer insulating layer 640 has a first power via hole, and the main power line VDD1 and the auxiliary power line VDD2 are electrically connected to each other through the first power via hole to achieve the effect of reducing resistance. Further, an orthographic projection of the main power line VDD on the base substrate 1000 and an orthographic projection of the auxiliary power line VDD2 on the base substrate 1000 have an overlapping region. Exemplarily, the auxiliary power line may be configured as a power line that transmits the driving voltage (i.e., the first voltage).

FIG. 5 is a schematic diagram of a cross-sectional structure in an AA' direction in the schematic diagram of the layout structure shown in FIG. 3. The first gate insulating layer 610 is disposed between the semiconductor layer 500 and the gate conductive layer 300, the second gate insulating layer 620 is disposed between the gate conductive layer 300 and the capacitor electrode layer 400, the interlayer dielectric layer 630 is disposed between the capacitor electrode layer 400 and the first conductive layer 100, and the interlayer insulating layer 640 is disposed between the first conductive layer 100 and the second conductive layer 200. Further, a planarization layer 650 is disposed on a side of the second conductive layer 200 away from the base substrate 1000, and a first electrode layer 600 is disposed on a side of the planarization layer 650 away from the base substrate 1000. A pixel defining layer 660, the light emitting function layer 0122, and a second electrode layer 0123 are sequentially disposed on a side of the first electrode layer 600 away from the base substrate 1000. The first electrode layer 600 may include a plurality of first electrodes spaced apart from each other, and the first electrodes are electrically connected to the transfer portion 351a through via holes penetrating the planarization layer 650. It should be noted that FIG. 5 does not show the via holes of the transfer portion 351a and the planarization layer 650.

As shown in FIG. 3 and FIG. 5, the sub-pixel spx may include a first connection through hole, a second connection through hole, a third connection through hole and a fourth connection through hole. The first connection through hole penetrates through the first gate insulating layer 610, the second gate insulating layer 620, and the interlayer dielectric layer 630; the second connection through hole penetrates through the second gate insulating layer 620 and the interlayer dielectric layer 630; the third connection through hole penetrates through the interlayer dielectric layer 630; and the fourth connection through hole penetrates through the interlayer insulating layer 640.

Exemplarily, the sub-pixel spx may include first connection through holes 381a, 382a, 384a, 387a, and 388a. The sub-pixel spx may include a second connection through hole 385a. The sub-pixel spx may include third connection through holes 386a and 3832a. The sub-pixel spx includes fourth connection through holes 385a and 3831a. The data line VD is electrically connected to a source region T2-S of the data writing transistor T2 in the semiconductor layer 500 through at least one first connection through hole 381a. The main power line VDD1 is electrically connected to the source region of the corresponding first light emitting control transistor T4 in the semiconductor layer 500 through at least one first connection through hole 382a. One end of the bridge portion 341a is electrically connected to the drain region of the corresponding first sub-compensation transistor T31 in the semiconductor layer 500 through at least one first connection through hole 384a. The other end of the bridge portion 341a is electrically connected to the gate (that is, the second electrode CC2a of the storage capacitor CST) of the driving transistor T1 in the gate conductive layer 300 through at least one second connection through hole 385a. One end of the bridge portion 342a is electrically connected to the first reset signal line VINIT1 through at least one third connection through hole 386a, and the other end of the bridge portion 342a is electrically connected to a source region T6-S of the first reset transistor T6 in the semiconductor layer 500 through at least one first connection through hole 387a. The bridge portion 343a is electrically connected to the drain region of the second light emitting control transistor T5 in the semiconductor layer 500 through at least one first connection through hole 388a. The main power line VDD1 is electrically connected to the first electrode CC1a of the storage capacitor CST in the capacitor electrode layer 400 through at least one third connection through hole 3832a. The main power line VDD1 is also electrically connected to the auxiliary power line VDD2 in the second conductive layer 200 through at least one fourth connection through hole 3831a (i.e., the first power via hole). The transfer portion 351a is electrically connected to the bridge portion 343a through at least one fourth connection through hole 385a.

Exemplarily, each of the first connection through holes 381a, 382a, 384a, 387a, and 388a in the sub-pixel may be disposed one or two or more. In practical applications, this may be designed and determined according to the requirements of practical application environments, which is not limited herein.

Exemplarily, one or two or more second connection through holes 385a in the sub-pixel may be disposed. In practical applications, this may be designed and determined according to the requirements of the practical application environments, which is not limited herein.

Exemplarily, one or two or more third connection through holes 386a and one or two or more third connection through holes 3832a in the sub-pixel may be disposed. In practical applications, this may be designed and determined according to the requirements of the practical application environments, which is not limited herein.

Exemplarily, one or two or more fourth connection through holes 385a and one or two or more fourth connection through holes 3831a in the sub-pixel may be disposed. In practical applications, this may be designed and determined according to the requirements of the practical application environments, which is not limited herein.

For example, as shown in FIGS. 3 to 4E, in the second direction F2, the first scanning line GA1, the second scanning line GA2, and the first reset signal line VINIT1 are all located on the first side of the gate of the driving transistor T1, and the light emitting control line EM is located on the second side of the driving transistor T1.

Exemplarily, the first scanning line GA1, the second scanning line GA2, and the light emitting control line EM may be located in the same layer (i.e., the gate conductive layer 300). The main power line VDD1 and the data line VD are located in the same layer (i.e., the first conductive layer 100).

It should be noted that a position arrangement relationship of the transistors in each sub-pixel spx is not limited to the examples shown in FIGS. 3 to 4E, and the positions of the above transistors may be specifically set according to practical application requirements.

It should be noted that the first direction F1 may be a row direction of the sub-pixel, and the second direction F2 may be a column direction of the sub-pixel. Or, the first direction F1 may also be the column direction of the sub-pixel, and the second direction F2 may be the row direction of the sub-pixel. In practical applications, setting is made according to the practical application requirements, which is not limited herein.

In practical applications, generally, the scanning lines and other conductive film layers will have a facing area, which will generate coupling capacitance. Since the scanning lines generally transmit a signal that controls the transistors to be turned-on or turned-off, due to the existence of the coupling capacitance, loading of the signal transmitted on the scanning lines is larger, which will reduce the stability of the signal transmitted on the scanning lines, thereby affecting the display effect.

In specific implementation, in the embodiment of the present disclosure, as shown in FIGS. 2a to 11, a first insulating layer may include: the second gate insulating layer 620 and the interlayer dielectric layer 630. The auxiliary power line VDD2 may include: a plurality of sub-auxiliary power lines 110 and a plurality of auxiliary conduction lines 120. The plurality of sub-auxiliary power lines 110 are arranged in the first direction F1 and extend in the second direction F2, and adjacent two of at least part of the sub-auxiliary power lines 110 are electrically connected by at least one auxiliary conduction line 120. In addition, an orthographic projection of at least one of the plurality of auxiliary conduction lines 120 on the base substrate 1000 does not overlap an orthographic projection of the scanning lines on the base substrate 1000. In this way, the facing area between the auxiliary conduction lines 120 and the scanning lines can be avoided, so that the coupling capacitance between the auxiliary conduction lines 120 and the scanning lines is avoided, the stability of the signal transmitted on the scanning lines can be improved, and the display effect can be improved.

Figure 6:
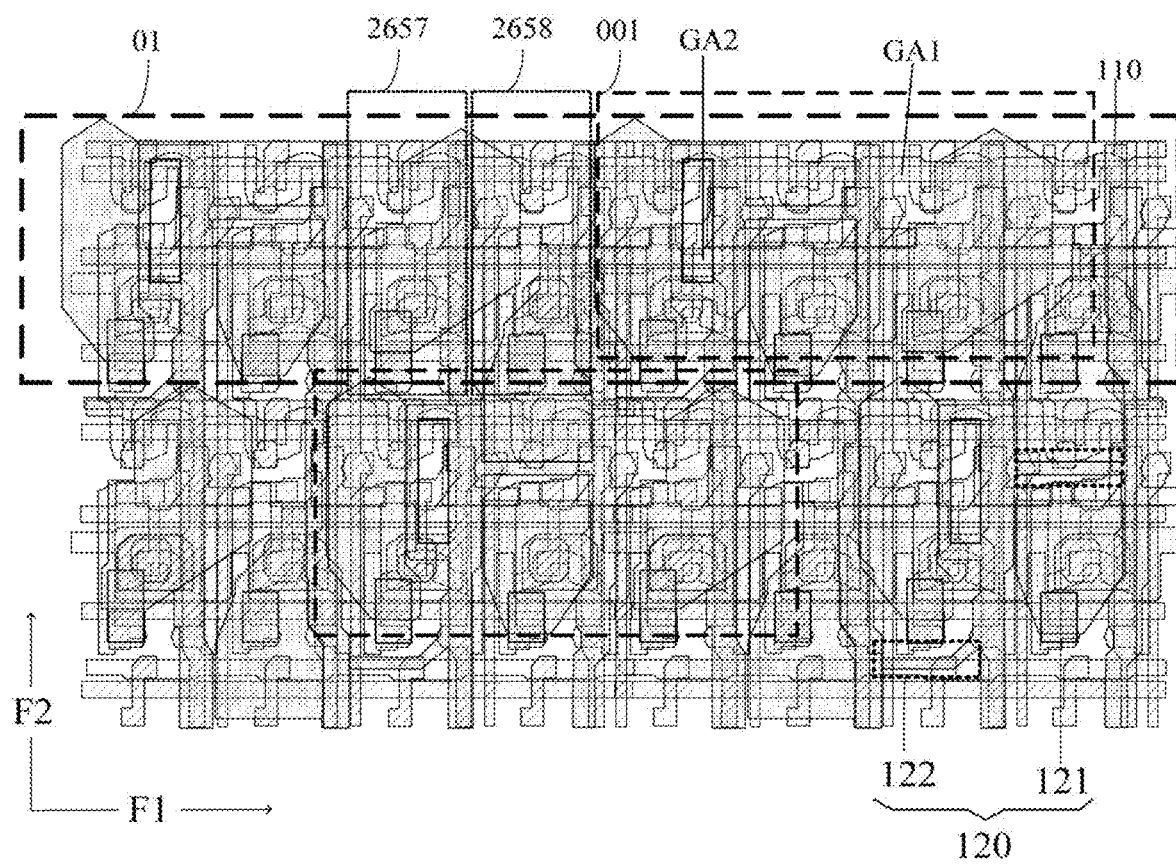
FIG. 6 is a schematic diagram of a layout structure of a plurality of sub-pixels in a display panel provided by an embodiment of the present disclosure.
Figure 7:
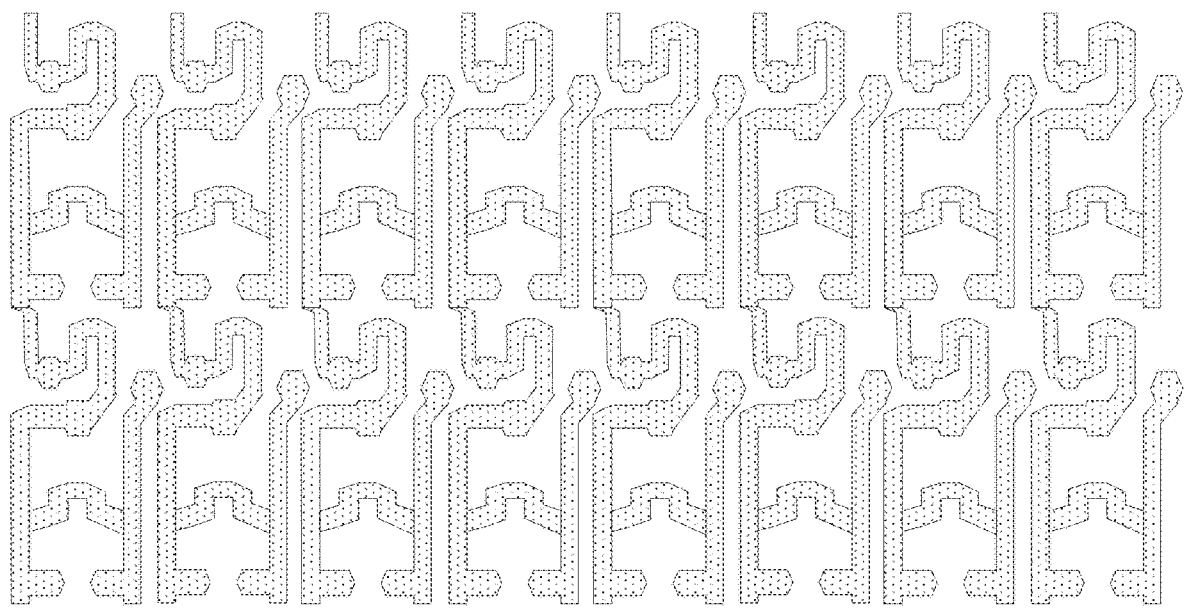
FIG. 7 is a schematic diagram of a layout structure of a semiconductor layer in a plurality of sub-pixels in a display panel provided by an embodiment of the present disclosure.
Figure 8:
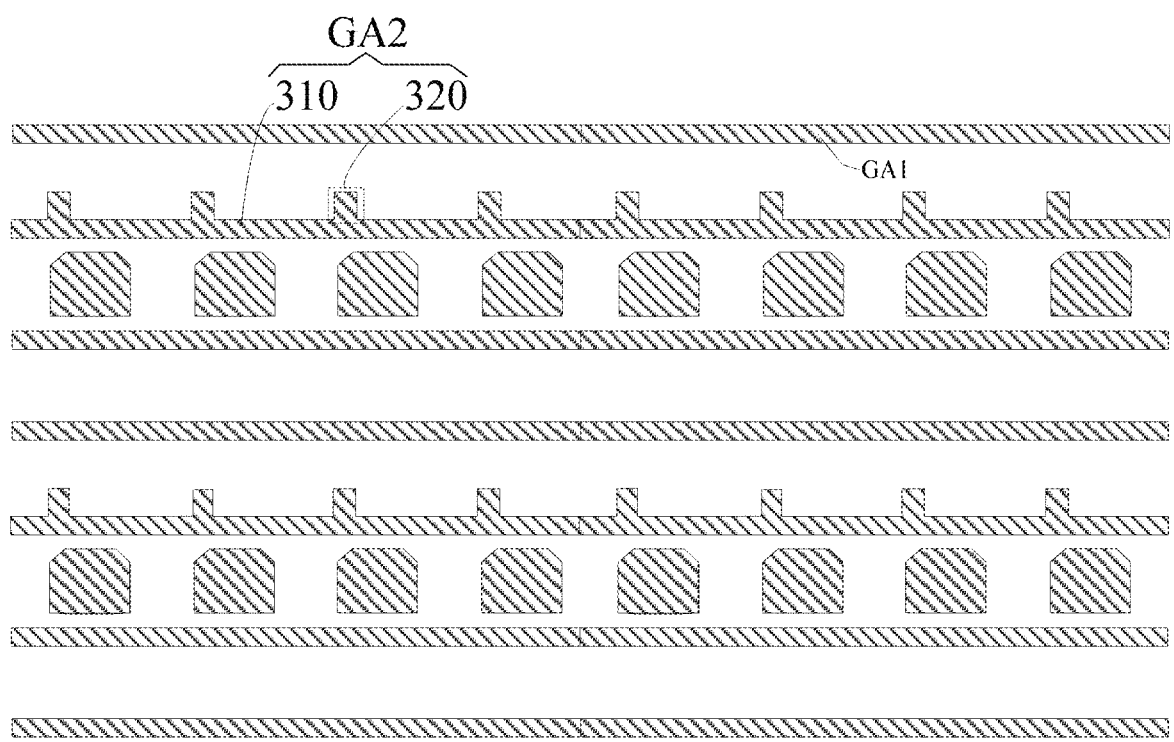
FIG. 8 is a schematic diagram of a layout structure of a gate conductive layer in a plurality of sub-pixels in a display panel provided by an embodiment of the present disclosure.
Figure 9:
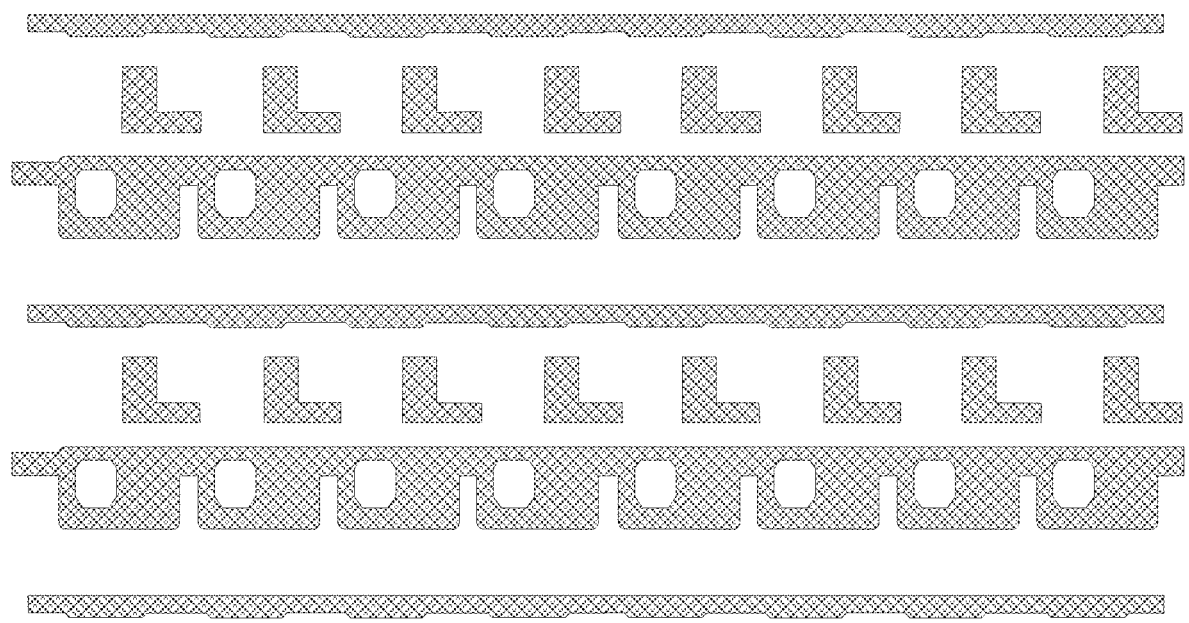
FIG. 9 is a schematic diagram of a layout structure of a capacitor electrode layer in a plurality of sub-pixels in a display panel provided by an embodiment of the present disclosure.
Figure 10:
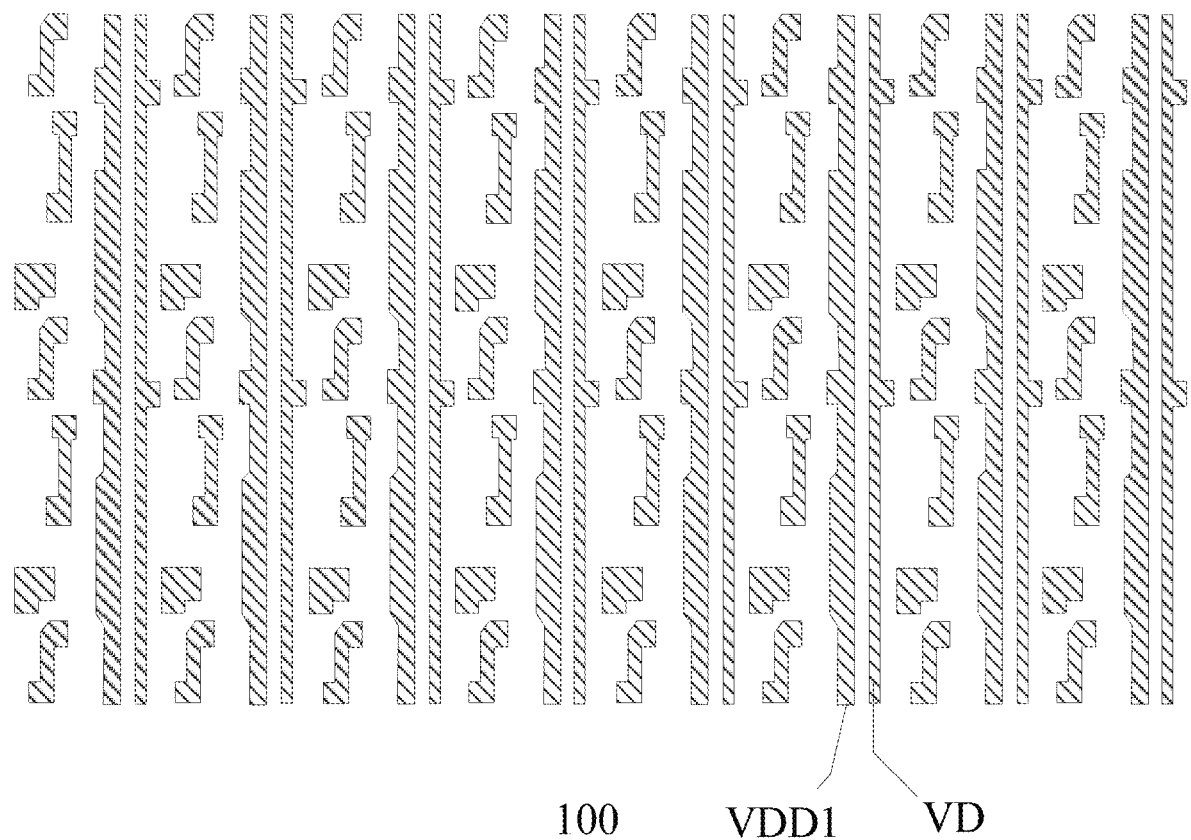
FIG. 10 is a schematic diagram of a layout structure of a first conductive layer in a plurality of sub-pixels in a display panel provided by an embodiment of the present disclosure.

Exemplarily, as shown in FIG. 6 and FIG. 8, the orthographic projection of at least one of the plurality of auxiliary conduction lines 120 on the base substrate 1000 does not overlap an orthographic projection of the first scanning line GA1 on the base substrate 1000. The orthographic projection of at least one of the plurality of auxiliary conduction lines 120 on the base substrate 1000 does not overlap an orthographic projection of the second scanning line GA2 on the base substrate 1000. Further, an orthographic projection of each auxiliary conduction line 120 on the base substrate 1000 does not overlap the orthographic projection of the first scanning line GA1 on the base substrate 1000. The orthographic projection of each auxiliary conduction line 120 on the base substrate 1000 does not overlap the orthographic projection of the second scanning line GA2 on the base substrate 1000.

It should be noted that the plurality of sub-auxiliary power lines 110 extend in the second direction F2, which may mean that these sub-auxiliary power lines 110 extend substantially in the second direction F2. In practical applications, these sub-auxiliary power lines 110 may extend in the second direction F2 in a zigzag manner.

Exemplarily, as shown in FIGS. 3 and 6 to 8, the second scanning line GA2 may include a scanning line portion 310 and a plurality of protrusion portions 320 that are electrically connected to each other. The scanning line portion 310 extends in the first direction F1, and the protrusion portions 320 extend in the second direction F2. In addition, the protrusion portions 320 may serve as the gates of the transistors, and the orthographic projection of each auxiliary conduction line 120 on the base substrate 1000 does not overlap an orthographic projection of the protrusion portions 320 on the base substrate 1000. In this way, the facing area between the auxiliary conduction lines 120 and the protrusion portions 320 can be avoided, and the coupling influence of the auxiliary conduction lines 120 on the gates of the transistors can be further reduced.

Exemplarily, as shown in FIGS. 3, 4B, and 6, a protrusion portion 320 may serve as the gate of the first sub-compensation transistor T31, and part of the scanning line portion 310 may serve as the gate of the second sub-compensation transistor T32. In this way, the facing area between the auxiliary conduction lines 120 and the protrusion portion 320 can be avoided, and the coupling influence of the auxiliary conduction lines 120 on the gate of the first sub-compensation transistor T31 can be further reduced.

It should be noted that the scanning line portion 310 extends in the first direction F1, which may mean that this scanning line portion 310 extends substantially in the first direction F1. In practical applications, the scanning line portion 310 may extend to form a straight line, or the scanning line portion 310 may also extend in the first direction F1 in a zigzag manner.

Exemplarily, as shown in FIGS. 6 to 12, the display panel further includes: a plurality of repeating elements 001. The repeating elements 001 include a plurality of sub-pixels spx; and the plurality of repeating elements 001 are arranged in the first direction F1 to form a repeating element row 01, and the repeating element row 01 is arranged in the second direction F2. Exemplarily, the repeating elements 001 in two adjacent repeating element rows 01 are arranged in a misalignment manner. Exemplarily, the repeating element 001 in two adjacent repeating element rows 01 differs by ½ of the size of the repeating element 001. It should be noted that the size of one repeating element 001 described above may be a distance between centers of the sub-pixels of the same color in two adjacent repeating elements 001 in the first direction F1. For example, the size of one repeating element 001 described above may be a distance between centers of first electrodes of first-color sub-pixels 010 in two adjacent repeating elements 001 in the second direction F2.

Or, for example, the repeating elements in the adjacent repeating element rows are misaligned from each other in the first direction, that is, the adjacent repeating elements in the adjacent repeating element rows have a certain offset in the first direction. Therefore, the sub-pixels of the same color in the adjacent repeating element rows are not aligned in the second direction. In some examples, the offset of the sub-pixels of the same color in the adjacent repeating element rows in the first direction may be half of the size of the repeating element in the first direction. For example, the size of one repeating element in the first direction may be a pitch of the repeating element in the first direction.

In specific implementation, in the embodiment of the present disclosure, as shown in FIGS. 6 to 12, the sub-pixels in the plurality of repeating elements include: the first-color sub-pixels 110, second-color sub-pixel pairs 020 and third-color sub-pixels 030 that are arranged in the first direction F1. Each second-color sub-pixel pair 020 may include two second-color sub-pixels arranged in the second direction F2. For example, each second-color sub-pixel pair 020 may include: a first second-color sub-pixel 021 and a second second-color sub-pixel 022 arranged in the second direction F2. Exemplarily, the first-color sub-pixels 010 are configured to emit light of a first color, the second-color sub-pixels 021 and 022 are configured to emit light of a second color, and the third-color sub-pixels are configured to emit light of a third color. In some examples, the first color, the second color and the third color may be selected from red, green, and blue. For example, the first color is red, the second color is green, and the third color is blue. Thus, the repeating elements 001 are of an arrangement structure of the red, green and blue sub-pixels. Of course, the embodiment of the present disclosure includes but is not limited thereto. The above first color, second color and third color may also be other colors.

Figure 11:
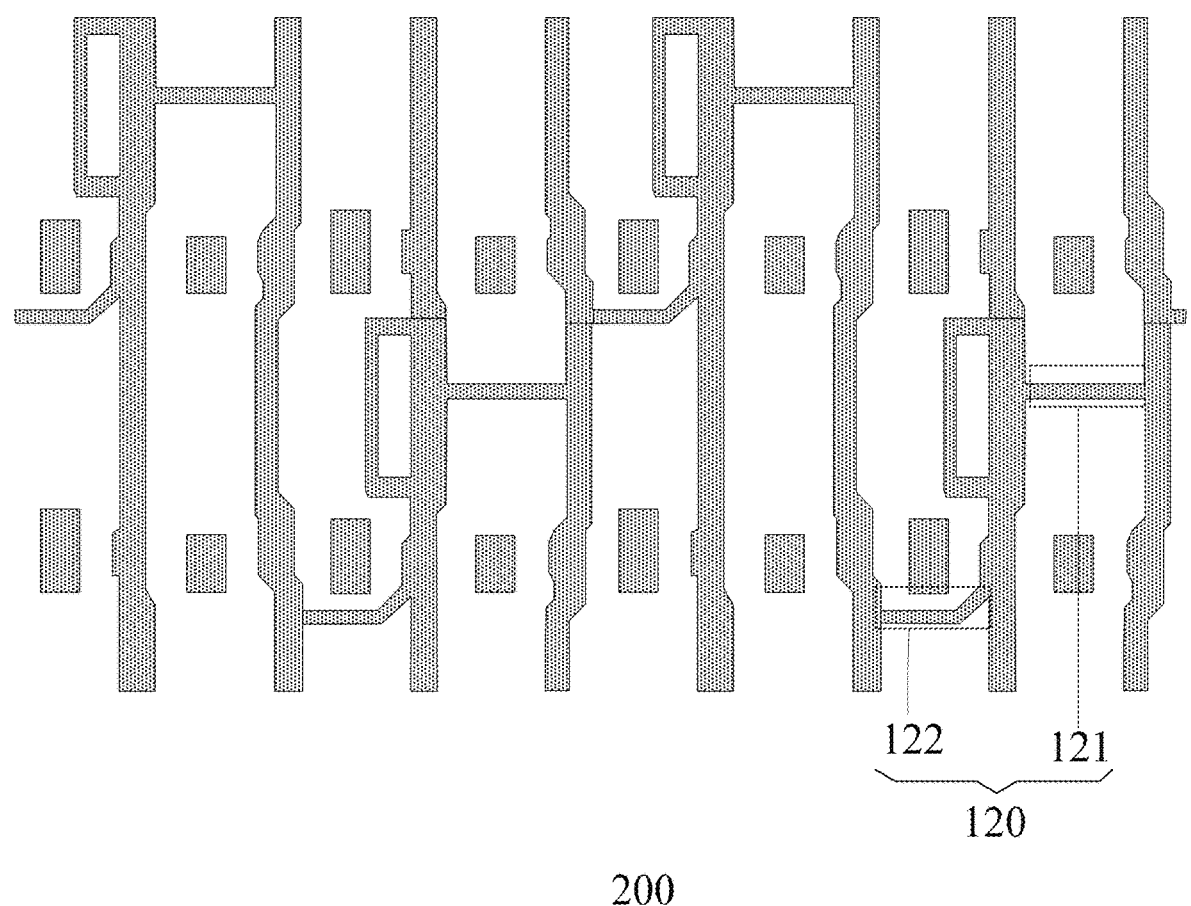
FIG. 11 is a schematic diagram of a layout structure of a second conductive layer in a plurality of sub-pixels in a display panel provided by an embodiment of the present disclosure.

In specific implementation, in the embodiment of the present disclosure, as shown in FIGS. 3, 6 and 11, the auxiliary conduction lines 120 may include first auxiliary conduction lines 121. Adjacent two of part of the sub-auxiliary power lines 110 are electrically connected by at least one first auxiliary conduction line 121. Exemplarily, adjacent two of part of the sub-auxiliary power lines 110 are electrically connected by one first auxiliary conduction line 121. Or, adjacent two of part of the sub-auxiliary power lines 110 are electrically connected by two first auxiliary conduction lines 121. Or, adjacent two of part of the sub-auxiliary power lines 110 are electrically connected by three first auxiliary conduction lines 121, or more first auxiliary conduction lines 121. This may be designed and determined according to the requirements of the practical application environments, which is not limited herein.

In specific implementation, in the embodiment of the present disclosure, as shown in FIG. 6 and FIG. 11, one repeating element row 01 may correspond to one first scanning line GA1, one second scanning line GA2, and at least one first auxiliary conduction line 121. Exemplarily, one repeating element row 01 may correspond to one, two, three or more first auxiliary conduction lines 121. This may be designed and determined according to the requirements of the practical application environments, which is not limited herein.

In specific implementation, in the embodiment of the present disclosure, as shown in FIG. 6 and FIG. 11, for the first scanning line GA1, the second scanning line GA2, and the first auxiliary conduction line 121 that correspond to the same repeating element row 01, an orthographic projection of the first auxiliary conduction line 121 on the base substrate 1000 is located between orthographic projections of the protrusion portions 320 of the first scanning line GA1 and the second scanning line GA2 on the base substrate 1000.

Figure 12:
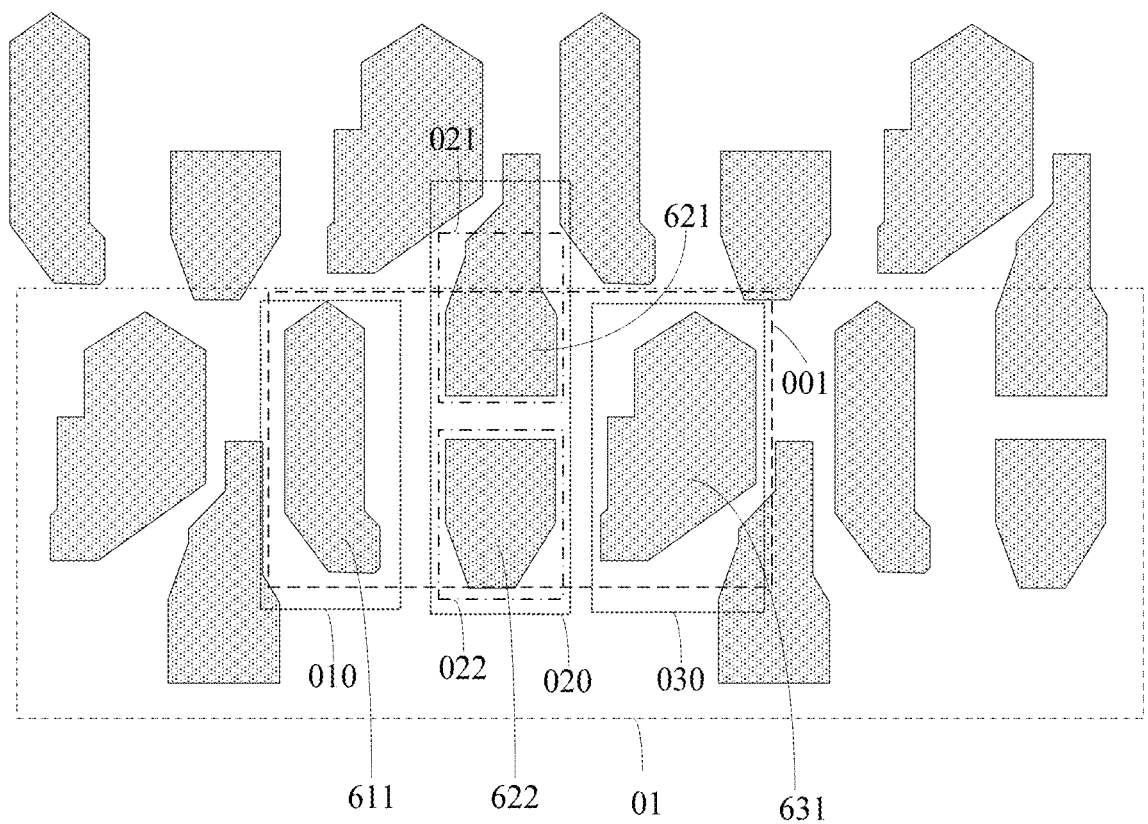
FIG. 12 is a schematic diagram of a layout structure of a first electrode layer in a plurality of sub-pixels in a display panel provided by an embodiment of the present disclosure.
Figure 13:
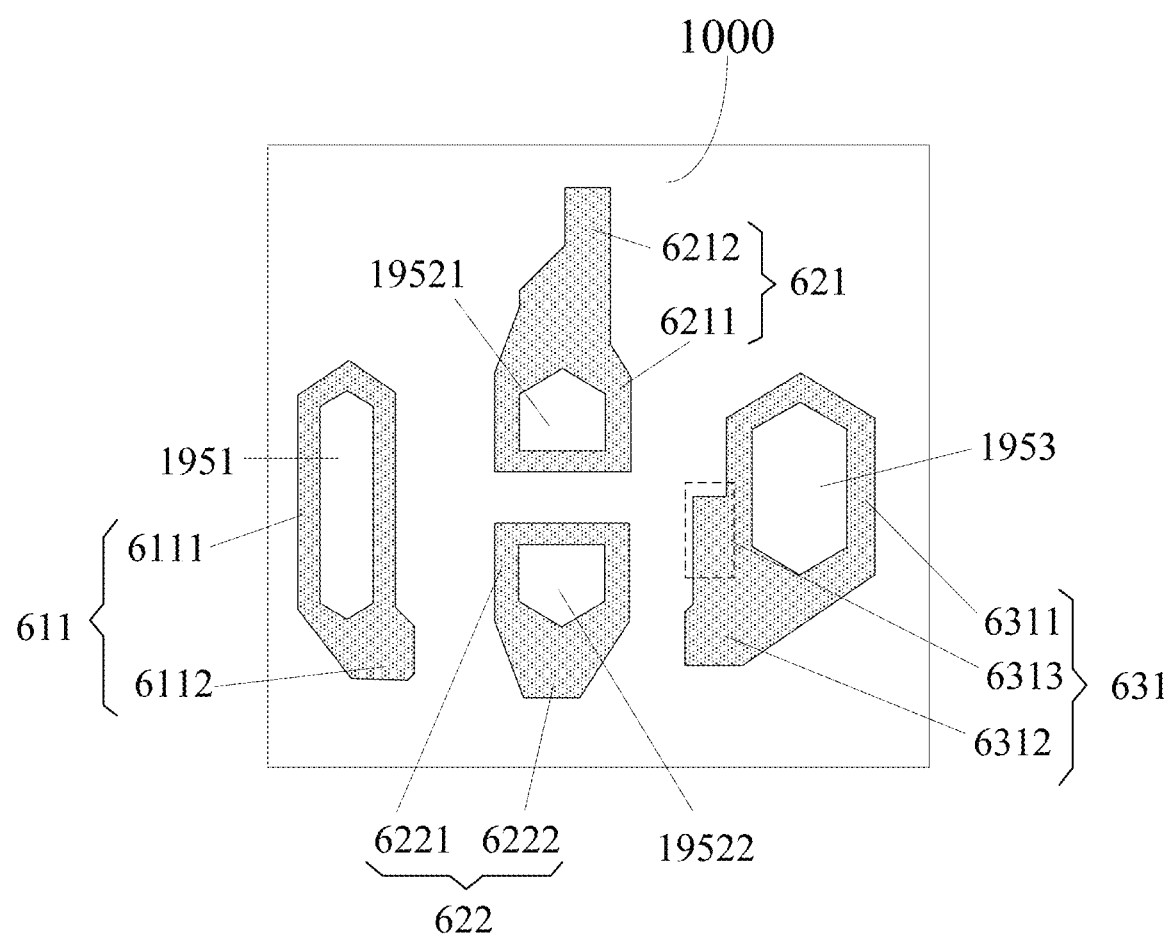
FIG. 13 is a schematic diagram of a layout structure of a first electrode layer in a repeating element in a display panel provided by an embodiment of the present disclosure.

In specific implementation, in the embodiment of the present disclosure, as shown in FIG. 6, FIG. 12 and FIG. 13, the first electrode layer 600 may include a plurality of first electrodes spaced apart from each other. One sub-pixel is provided with one first electrode. For example, the first-color sub-pixels 010 are provided with first electrodes 611, the first second-color sub-pixels 021 are provided with first electrodes 621, the second second-color sub-pixels 022 are provided with first electrodes 622, and the third-color sub-pixels 030 are provided with first electrodes 631. In addition, the orthographic projection of the first auxiliary conduction lines 121 on the base substrate 1000 does not overlap an orthographic projection of the first electrodes on the base substrate 1000.

In specific implementation, in the embodiment of the present disclosure, as shown in FIGS. 6 to 12, each of at least part of the second-color sub-pixel pairs corresponds to one first auxiliary conduction line 121. Exemplarily, each of part of the second-color sub-pixel pairs may correspond to one first auxiliary conduction line 121. Each of all the second-color sub-pixel pairs may also correspond to one first auxiliary conduction line 121. This may be designed and determined according to the requirements of the practical application environments, which is not limited herein.

In specific implementation, in the embodiment of the present disclosure, as shown in FIGS. 3 and 6 to 12, the orthographic projection of the first auxiliary conduction line 121 on the base substrate may be located between orthographic projections of two first electrodes in the corresponding second-color sub-pixel pair on the base substrate. Exemplarily, the orthographic projection of the first auxiliary conduction lines 121 on the base substrate 1000 may be located between the orthographic projection of the first electrodes 621 in the corresponding first second-color sub-pixel 021 and the orthographic projection of the first electrodes 622 in the corresponding second second-color sub-pixel 022 on the base substrate 1000.

In specific implementation, as shown in FIG. 3 and FIG. 6, the data writing transistors in a column of sub-pixels are electrically connected to one data line. For the second-color sub-pixel pair 020 and the first-color sub-pixel 010 in the same repeating element 001, an orthographic projection of the first auxiliary conduction line 121 corresponding to the second-color sub-pixel pair 020 on the base substrate 1000 and an orthographic projection of the data line VD electrically connected to the first-color sub-pixel 010 on the base substrate 1000 have an overlapping region. Further, in specific implementation, as shown in FIG. 3 and FIG. 6, for the second-color sub-pixel pair 020 and the first-color sub-pixel 010 in the same repeating element 001, the orthographic projection of the first auxiliary conduction line 121 corresponding to the second-color sub-pixel pair 020 on the base substrate 1000 and an orthographic projection of a first connection via hole in the first-color sub-pixel 010 on the base substrate 1000 have an overlapping region. The first connection through hole 381a serves as the first connection via hole.

In specific implementation, as shown in FIG. 3 and FIG. 6, the first reset transistor in each sub-pixel is electrically connected to the first reset signal line through a second connection via hole. The orthographic projection of the first auxiliary conduction line 121 on the base substrate and an edge of an orthographic projection of the second connection via hole in the second second-color sub-pixel on the base substrate have an overlapping region. Exemplarily, the first connection through hole 387a serves as the second connection via hole.

In specific implementation, as shown in FIG. 3 and FIG. 6, the first auxiliary conduction lines 121 extend in a linear shape in the first direction, so that the resistance can be reduced. Of course, the embodiment of the present disclosure includes but is not limited thereto, and the implementation of the above first auxiliary conduction lines 121 may also have other shapes.

In specific implementation, as shown in FIG. 6, the auxiliary conduction lines may also include second auxiliary conduction lines 122. Adjacent two the rest of the sub-auxiliary power lines 110 are electrically connected by at least one second auxiliary conduction line 122. In this way, every two adjacent sub-auxiliary power lines 110 may be electrically connected by the auxiliary conduction lines. Exemplarily, adjacent two the rest of the sub-auxiliary power lines 110 are electrically connected by one second auxiliary conduction line 122. Adjacent two the rest of the sub-auxiliary power lines 110 are electrically connected by two, three or more second auxiliary conduction lines 122. This may be designed and determined according to the requirements of the practical application environments, which is not limited herein.

In specific implementation, as shown in FIGS. 3 to 12, for the first-color sub-pixels 010 in one repeating element row 01 and the third-color sub-pixels 030 in the adjacent repeating element row and closest to the first-color sub-pixels 010, an orthographic projection of one second auxiliary conduction line 122 on the base substrate 1000 is disposed between an orthographic projection of the first electrode 611 in the first-color sub-pixel 010 on the base substrate 1000 and an orthographic projection of the first electrode 631 in the third-color sub-pixel 030 on the base substrate 1000. Further, for the first-color sub-pixels 010 in one repeating element row 01 and the third-color sub-pixels 030 in the adjacent repeating element row and closest to the first-color sub-pixels 010, the orthographic projection of the second auxiliary conduction line 122 on the base substrate 1000 is closer to the orthographic projection of the first electrode 631 in the third-color sub-pixel 030 on the base substrate 1000 than the orthographic projection of the first electrode 611 in the first-color sub-pixel 010 on the base substrate 1000.

In specific implementation, as shown in FIGS. 3 to 12, by providing the first auxiliary conduction lines 121 and the second auxiliary conduction lines 122, the sub-auxiliary power lines 110 and the auxiliary conduction lines can roughly form a grid structure.

On the other hand, the long-term light emitting stability of the light emitting device is generally also an important specification or index of the display panel. In the research, the publishers of the present application have noticed that: there are many factors that affect the long-term light emitting stability of the light emitting device, in addition to the life of a light emitting material itself, the working state of the transistors in the pixel driving circuit has a certain degree of influence on light emitting brightness and long-term light emitting stability.

In this regard, embodiments of the present disclosure provide some display panels. As shown in FIGS. 6 to 13, the display panel may include a base substrate 1000, pixel driving circuits, and a first electrode layer 600; and the first electrode layer 600 includes a plurality of first electrodes. One pixel driving circuit and one first electrode are arranged in a one-to-one correspondence manner, and each pixel driving circuit may include a threshold compensation transistor T3; and the display panel may also include a first pixel driving circuit 2657 and a second pixel driving circuit 2658 that are arranged adjacently, orthographic projections of a channel region of a threshold compensation transistor T3 in the pixel driving circuit 2657 and a channel region of a threshold value compensation transistor T3 in the second pixel driving circuit 2658 on the base substrate 1000 both have overlapping regions with an orthographic projection of the first electrode corresponding to the first pixel driving circuit 2657 on the base substrate. Therefore, the channel region of the threshold compensation transistor in the first pixel driving circuit and the channel region of the threshold compensation transistor in the second pixel driving circuit can be simultaneously shielded by the first electrode, thereby improving the stability and life of the threshold compensation transistors, so that the long-term light emitting stability and life of the display panel are improved.

It should be noted that the "first" and "second" in the above first pixel driving circuit and the second pixel driving circuit are only used to distinguish two pixel driving circuits in text. The specific structures of the two pixel driving circuits are the same.

In specific implementation, in the embodiments of the present disclosure, the orthographic projections of the channel region of the threshold compensation transistor T3 in the first pixel driving circuit 2657 and the channel region of the threshold compensation transistor T3 in the second pixel driving circuit 2658 on the base substrate 1000 both overlap the orthographic projection of the first electrode corresponding to the first pixel driving circuit 2657 on the base substrate, so that the first electrode corresponding to the first pixel driving circuit 2657 may partially shield or completely shield the channel region of the threshold compensation transistor T3 in the first pixel driving circuit 2657 and the channel region of the threshold compensation transistor T3 in the second pixel driving circuit 2658. Therefore, the display panel in the embodiments of the present disclosure can improve the stability and life of the threshold compensation transistor T3 in the first pixel driving circuit and the threshold compensation transistor T3 in the second pixel driving circuit 2658, thereby improving the long-term light emitting stability and life of the display panel.

In some examples, the channel region of the threshold compensation transistor T3 in the first pixel driving circuit 2657 and the channel region of the threshold compensation transistor T3 in the second pixel driving circuit 2658 may both fall into the orthographic projection of the first electrode corresponding to the first pixel driving circuit 2657 on the base substrate 1000, and the first electrode corresponding to the first pixel driving circuit 2657 may completely shield the channel region of the threshold compensation transistor T3 in the first pixel driving circuit 2657 and the channel region of the threshold compensation transistor T3 in the second pixel driving circuit 2658, thereby further improving the stability and life of the threshold compensation transistors, so that the long-term light emitting stability and life of the display panel are improved.

In some examples, as shown in FIGS. 2A, 3, 4A and 6, each threshold compensation transistor T3 may be a thin film transistor of a double-gate structure, so that the reliability of the threshold compensation transistor may be improved. An active layer of the threshold compensation transistor T3 includes a first channel region T31-A and a second channel region T32-A arranged at an interval, and a common conductive region SE between the first channel region T31-A and the second channel region T32-A. In addition, orthographic projections of the common conductive region SE of the threshold compensation transistor T3 in the first pixel driving circuit 2657 and the common conductive region SE of the threshold compensation transistor T3 in the second pixel driving circuit 2658 on the base substrate 1000 both have overlapping regions with the orthographic projection of the first electrode corresponding to the first pixel driving circuit 2657 on the base substrate 1000. Therefore, the first electrode corresponding to the first pixel driving circuit 2657 may partially or completely shield the common conductive region SE of the threshold compensation transistor T3 in the first pixel driving circuit 2657 and the common conductive region SE of the threshold compensation transistor T3 in the second pixel driving circuit 2658, thereby further improving the stability and life of the threshold compensation transistors, so that the long-term light emitting stability and life of the display panel are improved.

Exemplarily, as shown in FIGS. 6, 12 and 13, the first pixel driving circuit 2657 and the second pixel driving circuit 2658 are disposed in a first direction F1. The first pixel driving circuit 2657 is electrically connected to a first electrode 631 in one repeating element 001 correspondingly. The second pixel driving circuit 2658 is electrically connected to a first electrode 621 in another repeating element 001 correspondingly. In addition, the first electrode 631 electrically connected to the first pixel driving circuit 2657 and the first electrode 621 electrically connected to the second pixel driving circuit 2658 are respectively located in different repeating element rows 01, and the repeating element rows 01 where the first electrode 631 electrically connected to the first pixel driving circuit 2657 and the first electrode 621 electrically connected to the second pixel driving circuit 2658 are adjacent.

Exemplarily, as shown in FIGS. 5, 6, 12 and 13, the pixel defining layer 660 includes a plurality of openings; and the plurality of openings includes a first opening 1951, a second opening 19521, a third opening 19522 and a fourth opening 1953. The first opening 1951 is disposed corresponding to the first electrode 611 and exposes the first electrode 611, the second opening 19521 is disposed corresponding to the first electrode 621 and exposes the first electrode 621, the third opening 19522 is disposed corresponding to the first electrode 622 and exposes the first electrode 611, and the fourth opening 1953 is disposed corresponding to the first electrode 631 and exposes the first electrode 631.

Exemplarily, as shown in FIGS. 6, 12 and 13, the first electrode 611 includes a first body portion 6111 and a first connection portion 6112 that are electrically connected to each other, an orthographic projection of the first opening 1951 on the base substrate 1000 falls within an orthographic projection of the first body portion 6111 on the base substrate 1000, and the first connection portion 6112 is electrically connected to the pixel driving circuit corresponding to the first electrode 611.

Exemplarily, as shown in FIGS. 6, 12, and 13, the first electrode 621 includes a second body portion 6211 and a second connection portion 6212 that are electrically connected to each other, an orthographic projection of the second opening 19521 on the base substrate 1000 falls within an orthographic projection of the second body portion 6211 on the base substrate 1000, and the second connection portion 6212 is electrically connected to the pixel driving circuit corresponding to the first electrode 621.

Exemplarily, as shown in FIGS. 6, 12, and 13, the first electrode 622 includes a third body portion 6221 and a third connection portion 6222 that are electrically connected to each other, an orthographic projection of the third opening 19522 on the base substrate 1000 falls within an orthographic projection of the third body portion 6221 on the base substrate 1000, and the third connection portion 6222 is electrically connected to the pixel driving circuit corresponding to the first electrode 622.

Exemplarily, as shown in FIGS. 6, 12, and 13, the first electrode 631 includes a fourth body portion 6311 and a fourth connection portion 6312, an orthographic projection of the fourth opening 1953 on the base substrate 1000 falls within an orthographic projection of the fourth body portion 6311 on the base substrate 1000, and the fourth connection portion 6312 is electrically connected to the pixel driving circuit (for example, the above first pixel driving circuit 2657) corresponding to the first electrode 631.

In some examples, as shown in FIGS. 6, 12, and 13, a shape of the first body portion 6111 is approximately the same as that of the first opening 1951; a shape of the second body portion 6211 is approximately the same as that of the second opening 19521; a shape of the third body portion 6221 is approximately the same as that of the third opening 19522; and a shape of the fourth body portion 6311 is approximately the same as that of the fourth opening 1953. For example, when the shape of the fourth opening 1953 is a hexagon, the shape of the fourth body portion 6311 is also a hexagon. Of course, the shapes of the fourth opening and the fourth body portion are not limited to hexagons, for example, other shapes such as ellipses.

In some examples, as shown in FIGS. 4A, 6, 12, and 13, the first electrode 631 may further include a first supplement portion 6313. Orthographic projections of the first channel region T31-A and the second channel region T32-A of the threshold compensation transistor T3 in the first pixel driving circuit 2657 corresponding to the first electrode 631 on the base substrate 1000 respectively overlap an orthographic projection of the first supplement portion 6313 on the base substrate 1000. In the display panel, by adding the first supplement portion to the first electrode, the first electrode may overlap or cover the two channel regions of the threshold compensation transistor in the corresponding pixel driving circuit, thereby improving the stability and life of the threshold compensation transistor, so that the long-term light emitting stability and life of the display panel are improved.

In some examples, as shown in FIGS. 6, 12, and 13, the first supplement portion 6313 protrudes from the fourth body portion 6311 towards the first electrode 622, and the first supplement portion 6313 is located on a side of the fourth connection portion 6312 close to the fourth body portion 6311.

In some examples, as shown in FIGS. 6, 12, and 13, the first supplement portion 6313 is electrically connected to the fourth body portion 6311 and the fourth connection portion 6312. Therefore, the display panel can make full use of an area on the display panel, and the first electrode may be arranged closely, so that the resolution ratio of the display panel can be ensured.

In some examples, as shown in FIGS. 6, 12 and 13, the orthographic projection of the channel region of the threshold compensation transistor T3 in the pixel driving circuit corresponding to the first electrode 611 on the base substrate 1000 falls within an orthographic projection of the first body part 6111 on the base substrate 1000.

In some examples, as shown in FIGS. 6, 12 and 13, the orthographic projection of the second channel region T32-A of the threshold compensation transistor T3 in the pixel driving circuit 265 corresponding to the first electrode 622 on the base substrate 1000 falls within an orthographic projection of the third body portion 6221 on the base substrate 1000.

Figure 14:
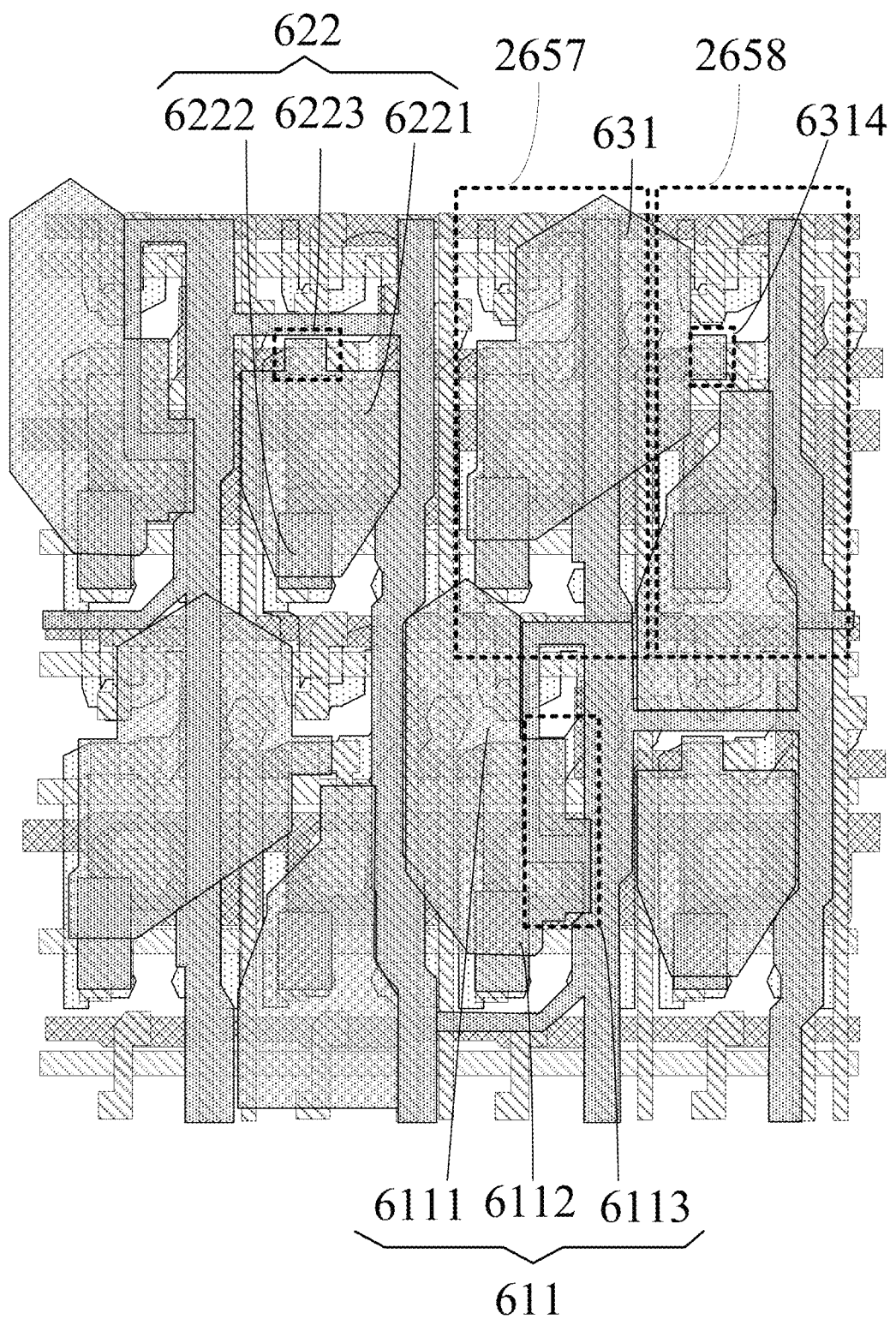
FIG. 14 is a schematic diagram of a layout structure of another some sub-pixels in a display panel provided by an embodiment of the present disclosure.

Further, as shown in FIG. 14, the first electrode 631 may also include a second supplement portion 6314; and the orthographic projection of the first channel region T31-A of the threshold compensation transistor T3 in the second pixel driving circuit 2658 on the base substrate 1000 overlaps an orthographic projection of the second supplement portion 6314 on the base substrate 1000. By adding the second supplement portion to the first electrode, the first electrode may partially or even completely cover the first channel region T31-A of the threshold compensation transistor T3 in the second pixel driving circuit 2658, thereby improving the stability and life of the threshold compensation transistor, so that the long-term light emitting stability and life of the display panel are improved.

In some examples, as shown in FIG. 14, the second supplement portion 6314 protrudes from the fourth body portion 6311 towards the adjacent first electrode 611 in the first direction.

It should be noted that, as shown in FIG. 14, the orthographic projection of the second channel region T32-A of the threshold compensation transistor T3 in the second pixel driving circuit 2658 on the base substrate 1000 may fall within an orthographic projection of the fourth body portion 6311 on the base substrate 1000.

In some examples, as shown in FIG. 14, the common conductive region SE of the threshold compensation transistor T3 in the first pixel driving circuit 2657 overlaps the orthographic projection of the first supplement portion 6313 on the base substrate 1000. The orthographic projection of the common conductive region SE of the threshold compensation transistor T3 in the two pixel driving circuits 2658 on the base substrate 1000 overlaps the orthographic projection of the fourth body portion 6311 of the first electrode 631 corresponding to the first pixel driving circuit 2657 on the base substrate 1000.

Further, as shown in FIG. 14, the first electrode 611 may also include a third supplement portion 6113, which protrudes from the first body portion 6111 towards the first electrode 622, and orthographic projections of a gate of a driving thin film transistor T1 and a drain region of the threshold compensation transistor T3 in the pixel driving circuit corresponding to the first electrode 611 on the base substrate 1000 fall within an orthographic projection of the third supplement portion 6113 on the base substrate 1000. Therefore, the display panel can stabilize potentials on the gate of the driving thin film transistor T1 and a drain electrode of the threshold compensation transistor T3 through the third supplement portion 6113, thereby further improving the long-term light emitting stability and life of the display panel.

Further, as shown in FIG. 14, the first electrode 622 may also include a fourth supplement portion 6223, and the orthographic projection of the first channel region T31-A of the threshold compensation transistor T3 in the pixel driving circuit corresponding to the first electrode 622 on the base substrate 1000 falls within an orthographic projection of the fourth supplement portion 6223 on the base substrate 1000. Therefore, the third body portion 6221 and the fourth supplement portion 6223 of the first electrode 622 may partially or completely shield the first channel region T31-A and the second channel region T32-A of the threshold compensation transistor T3 in the pixel driving circuit corresponding to the first electrode 622, thereby improving the stability and life of the threshold compensation transistor, so that the long-term light emitting stability and life of the display panel are improved.

Based on the same inventive concept, an embodiment of the present disclosure also provides a display apparatus, including the above display panel provided by the embodiments of the present disclosure. The display apparatus may be any product or component with a display function, such as a mobile phone, a tablet computer, a television, a displayer, a notebook computer, a digital photo frame, a navigator, and the like. Other indispensable components of the display apparatus are understood by those ordinarily skilled in the art, will not be repeated here, and should not be used as a limitation to the present disclosure. The implementation of the display apparatus may refer to the embodiments of the above display panel, and the repetition is not repeated herein.

Although the preferred embodiments of the present disclosure have been described, additional variations and modifications may be made to these embodiments by those skilled in the art once the basic inventive concept is known. Therefore, it is intended that the appended claims be interpreted as including the preferred embodiments and all variations and modifications that fall within the scope of the present disclosure.

It will be apparent to those skilled in the art that various modifications and variations can be made in the embodiments of the present disclosure without departing from the spirit or scope of the embodiments of the present disclosure. Thus, if these modifications and variations of the embodiments of the present disclosure fall within the scope of the claims of the present disclosure and its equivalent technology, the present disclosure is also intended to include these modifications and variations.

What is claimed is:

1. A display panel, comprising:
a base substrate;
a gate conductive layer on the base substrate, comprising a plurality of scanning lines;
a first insulating layer on the gate conductive layer;
a first conductive layer on a side of the first insulating layer away from the base substrate, comprising a plurality of data lines, wherein the plurality of data lines are arranged in a first direction;
an interlayer insulating layer on a side of the first conductive layer away from the base substrate; and
a second conductive layer on a side of the interlayer insulating layer away from the base substrate, comprising an auxiliary power line; wherein
the auxiliary power line comprises: a plurality of sub-auxiliary power lines and a plurality of auxiliary conduction lines; the plurality of sub-auxiliary power lines are arranged in the first direction and extend in a second direction, and adjacent two of at least part of the sub-auxiliary power lines are electrically connected by at least one auxiliary conduction line; the first direction and the second direction are different; and
an orthographic projection of at least one of the plurality of auxiliary conduction lines on the base substrate does not overlap an orthographic projection of the scanning lines on the base substrate;
wherein the plurality of scanning lines comprise first scanning lines and second scanning lines; one second scanning line comprises: a scanning line portion and a plurality of protrusion portions that are electrically connected to each other; the scanning line portion extend in the first direction, and the protrusion portions extend in the second direction;
the display panel further comprises: a plurality of sub-pixels; at least one of the plurality of sub-pixels comprises a pixel driving circuit; the pixel driving circuit comprises a transistor; and
the protrusion portions serve as a gate of the transistor, and an orthographic projection of each of the auxiliary conduction lines on the base substrate does not overlap an orthographic projection of the protrusion portions on the base substrate;
wherein the display panel further comprises: a plurality of repeating elements; the repeating elements comprise the plurality of sub-pixels; the plurality of repeating elements form repeating element rows, repeating elements in each repeating element row are arranged in the first direction, and the repeating element rows are arranged in the second direction;
the auxiliary conduction lines comprise first auxiliary conduction lines; adjacent two of part of the sub-auxiliary power lines are electrically connected by at least one first auxiliary conduction line of the first auxiliary conduction lines;
one repeating element row corresponds to one first scanning line, one second scanning line and at least one first auxiliary conduction line; and
for the first scanning line, the second scanning line and the first auxiliary conduction line that correspond to the same repeating element row, an orthographic projection of the first auxiliary conduction line on the base substrate is between orthographic projections of the first scanning line and the protrusion portions of the second scanning line on the base substrate.

2. The display panel according to claim 1, wherein the pixel driving circuit comprises: a driving transistor and a threshold compensation transistor; the threshold compensation transistor comprises: a first sub-compensation transistor and a second sub-compensation transistor;
a gate of the first sub-compensation transistor is electrically connected to a second scanning line, a first electrode of the first sub-compensation transistor is electrically connected to a gate of the driving transistor, and a second electrode of the first sub-compensation transistor is electrically connected to a first electrode of the second sub-compensation transistor;
a gate of the second sub-compensation transistor is electrically connected to the second scanning line, and a second electrode of the second sub-compensation transistor is electrically connected to a second electrode of the driving transistor;
the protrusion portions serve as the gate of the first sub-compensation transistor; and
part of a scanning line portion serves as the gate of the second sub-compensation transistor.

3. The display panel according to claim 1, further comprising:
a planarization layer on a side of the second conductive layer away from the base substrate; and
a first electrode layer on a side of the planarization layer away from the base substrate, comprising a plurality of first electrodes spaced apart from each other; wherein one sub-pixel is provided with one first electrode; and
an orthographic projection of the first auxiliary conduction lines on the base substrate does not overlap an orthographic projection of the first electrodes on the base substrate.

4. The display panel according to claim 1, wherein the sub-pixels in the plurality of repeating elements comprise: first-color sub-pixels, second-color sub-pixel pairs and third-color sub-pixels arranged in the first direction; each of the second-color sub-pixel pairs comprises two second-color sub-pixels arranged in the second direction; and the repeating elements in two adjacent repeating element rows are arranged in a misalignment manner.

5. The display panel according to claim 4, wherein each of at least part of the second-color sub-pixel pairs corresponds to one first auxiliary conduction line; and
the orthographic projection of the first auxiliary conduction line on the base substrate is between orthographic projections of two first electrodes in the second-color sub-pixel pair, corresponding to the first auxiliary conduction line, on the base substrate.

6. The display panel according to claim 5, wherein the pixel driving circuit further comprises a data writing transistor; data writing transistors in a column of sub-pixels are electrically connected to one data line; and
for the second-color sub-pixel pair and the first-color sub-pixel in the same repeating element, an orthographic projection of the first auxiliary conduction line corresponding to the second-color sub-pixel pair on the base substrate and an orthographic projection of the data line electrically connected to the first-color sub-pixel on the base substrate have an overlapping region.

7. The display panel according to claim 6, wherein the data writing transistor is electrically connected to the data line by a first connection via hole; and
for the second-color sub-pixel pair and the first-color sub-pixel in the same repeating element, the orthographic projection of the first auxiliary conduction line corresponding to the second-color sub-pixel pair on the base substrate and an orthographic projection of the first connection via hole in the first-color sub-pixel on the base substrate have an overlapping region.

8. The display panel according to claim 7, wherein the pixel driving circuit further comprises a first reset transistor; the display panel further comprises a plurality of first reset signal lines; the first reset transistor in each of the sub-pixels is electrically connected to a first reset signal line through a second connection via hole; and the second-color sub-pixel pair comprises: a first second-color sub-pixel and a second second-color sub-pixel arranged in the second direction; the orthographic projection of the first auxiliary conduction line on the base substrate and an edge of an orthographic projection of the second connection via hole in the second second-color sub-pixel on the base substrate have an overlapping region.

9. The display panel according to claim 1, wherein the first auxiliary conduction lines extend in a linear shape in the first direction.

10. The display panel according to claim 1, wherein the auxiliary conduction lines further comprise second auxiliary conduction lines; and adjacent two of the rest of the sub-auxiliary power lines are electrically connected by at least one second auxiliary conduction line.

11. The display panel according to claim 10, wherein for the first-color sub-pixel in one repeating element row and a third-color sub-pixel, closest to the first-color sub-pixel, in an adjacent repeating element row, an orthographic projection of one second auxiliary conduction line on the base substrate is between an orthographic projection of a first electrode in the first-color sub-pixel on the base substrate and an orthographic projection of a first electrode in the third-color sub-pixel on the base substrate.

12. The display panel according to claim 11, wherein for the first-color sub-pixel in one repeating element row and the third-color sub-pixel, closest to the first-color sub-pixel, in the adjacent repeating element row, the orthographic projection of the second auxiliary conduction line on the base substrate is closer to the orthographic projection of the first electrode in the third-color sub-pixel on the base substrate than the orthographic projection of the first electrode in the first-color sub-pixel on the base substrate.

13. The display panel according to claim 1, wherein the first conductive layer further comprises a main power line; the main power line and the data lines are spaced apart;

the interlayer insulating layer has a first power via hole; and the main power line and the auxiliary power line are electrically connected to each other through the first power via hole.

14. The display panel according to claim 13, wherein an orthographic projection of the main power line on the base substrate and an orthographic projection of the auxiliary power line on the base substrate have an overlapping region.

15. The display panel according to claim 1, wherein the sub-auxiliary power lines and the auxiliary conduction lines roughly form a grid structure.

16. The display panel according to claim 1, wherein the auxiliary power line is configured as a power line that transmits a driving voltage.

17. A display apparatus, comprising the display panel according to claim 1.

* * * * *